(12) United States Patent
Oh

(10) Patent No.: US 7,292,061 B2
(45) Date of Patent: Nov. 6, 2007

(54) SEMICONDUCTOR INTEGRATED CIRCUIT HAVING CURRENT LEAKAGE REDUCTION SCHEME

(75) Inventor: HakJune Oh, Kanata (CA)

(73) Assignee: Masaid Technologies Incorporated, Kanata, Ontario (CA)

( * ) Notice: Subject to any disclaimer, the term of this patent is extended or adjusted under 35 U.S.C. 154(b) by 95 days.

(21) Appl. No.: 11/238,975

(22) Filed: Sep. 30, 2005

(65) Prior Publication Data

US 2007/0075743 A1    Apr. 5, 2007

(51) Int. Cl.
*H03K 17/16* (2006.01)
*H03K 19/003* (2006.01)

(52) U.S. Cl. .................. 326/33; 326/119; 326/121
(58) Field of Classification Search ............... 326/17, 326/33, 82–83, 112, 119, 121; 327/112
See application file for complete search history.

(56) References Cited

U.S. PATENT DOCUMENTS

| 5,486,774 | A |   | 1/1996 | Douseki et al. |
| 5,751,651 | A | * | 5/1998 | Ooishi ................. 365/226 |
| 6,515,521 | B2 | * | 2/2003 | Kono et al. ............. 327/108 |
| 6,696,865 | B2 |   | 2/2004 | Horiguchi et al. |
| 2006/0012397 | A1 | * | 1/2006 | Cooper ................. 326/83 |
| 2006/0055424 | A1 | * | 3/2006 | Park et al. ............. 326/81 |

OTHER PUBLICATIONS

Horiguchi et al., "Switched-Source-Impedance CMOS Circuit for Low Standby Subthreshold Current Giga-Scale LSI's", *IEEE Journal of Solid-State Circuits*, vol. 28, No. 11, Nov. 1993, pp. 1131-1135.

* cited by examiner

*Primary Examiner*—Anh Q. Tran
(74) *Attorney, Agent, or Firm*—Shin Hung; Borden Ladner Gervais LLP

(57) ABSTRACT

A semiconductor integrated circuit includes a CMOS controlled inverter consisting of series-connected PMOS and NMOS transistors. The source of the NMOS transistor is coupled to a ground line through an additional NMOS transistor for power gating of voltage VSS. The source of the PMOS transistor can be coupled to a power supply line through an additional PMOS transistor for power gating of voltage VDD. The inverter receives an input signal IN and its complementary version that has transitioned earlier than the input signal. In response to the input signal, the inverter produces an output signal. A NAND gate that receives the output signal and the complementary input signal controls the power gating NMOS transistor. A NOR gate that receives the output signal and the complementary input signal controls the power gating PMOS transistor. The power gating to the CMOS inverter is performed by feedback of the output signal and the complementary input signal, with the result that current leakage reduction through the CMOS controlled inverter is achieved. A self leakage reduction with power gating transistors is applicable to another type of logic gates such as NAND, NOR and Exclusive-OR, AND, OR.

10 Claims, 17 Drawing Sheets

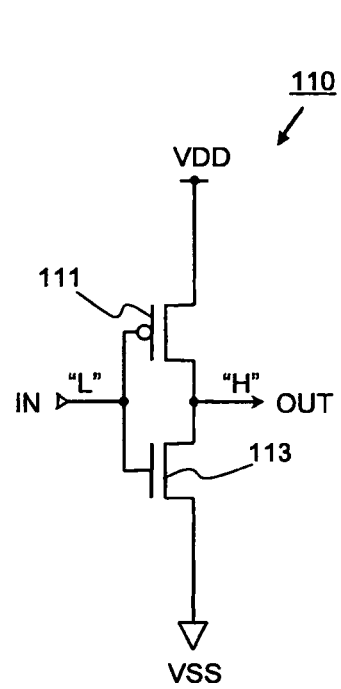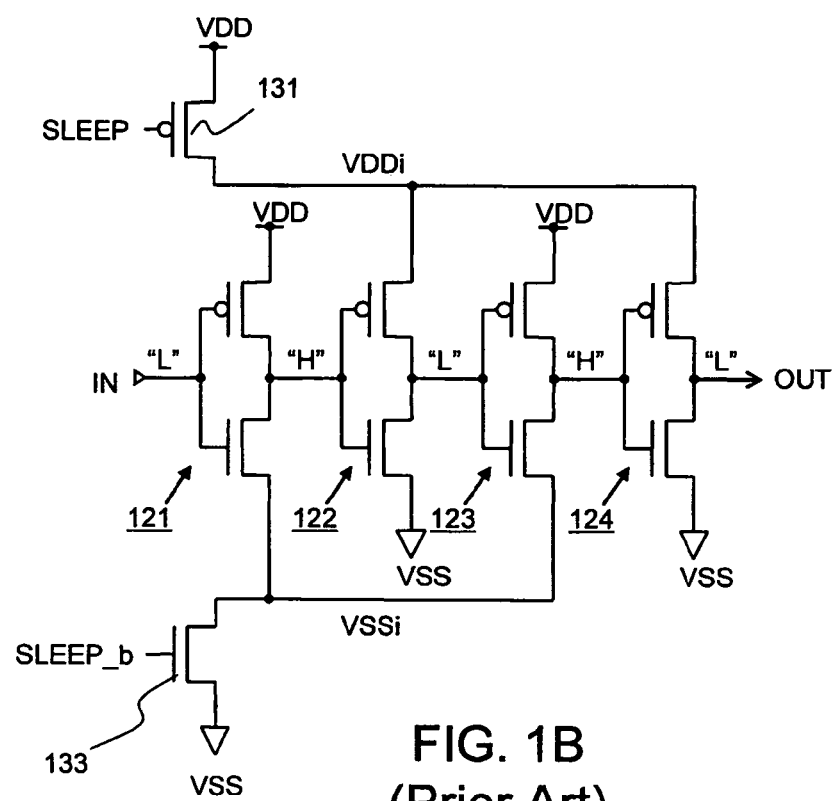
FIG. 1A
(Prior Art)
FIG. 1B
(Prior Art)

SEMICONDUCTOR INTEGRATED CIRCUIT HAVING CURRENT LEAKAGE REDUCTION SCHEME

TECHNICAL FIELD

The present invention generally relates to semiconductor integrated circuits and in particular to semiconductor integrated circuits with low power consumption requirements.

BACKGROUND INFORMATION

In order to obtain a high-speed operation and high-density integrated circuits (ICs) for the purpose of cost reduction, deep sub-micron CMOS processes like 90 nm, 65 nm, 45 nm have been introduced and implemented in many semiconductor IC devices. For those deep sub-micron processes, MOS transistors have to be scaled down (i.e., have minimum transistor dimensions decreased) and threshold voltage Vth of the transistors have to be lowered. However, the lowered threshold voltage results in significant sub-threshold leakage (i.e., leakage current present for transistor gate voltages below a threshold voltage) and therefore, semiconductor ICs based on such lowered threshold voltages consume more power in normal operation as well as power-down mode operation.

In the description, the term "standby" is used broadly and it includes a state wherein leakage current flows in a transistor while it is in substantially off state.

Conventional semiconductor ICs such as inverter logic gates, NAND logic gates and NOR logic gates are generally constituted by CMOS logic blocks with P-type transistors and N-type transistors. As the size of MOS transistors is scaled down, threshold voltage is lowered. In order to avoid an increase in standby leakage current, many schemes have been introduced.

FIG. 1A shows a simple inverter logic circuit, as an example of a conventional circuit found in semiconductor ICs. Referring to FIG. 1A, an inverter circuit 110 is comprised of a PMOS transistor 111 and an NMOS transistor 113 that are connected in series between a power supply line of high level voltage VDD and a ground line of low level voltage VSS. Transistors with different threshold voltages are currently offered by most semiconductor device manufacturers. For example, PMOS and NMOS transistors are available having "low" and "high" threshold values, sometimes referred to as a dual or multi-level threshold process. Typically "low" threshold transistors are used in circuits targeted for high speed applications whereas "high" threshold transistors are used in low power applications. Often semiconductor devices will have a combination of such low and high threshold transistors on the same device, depending on the particular circuit's application. In FIG. 1A, a typical inverter logic circuit is shown having the dual-threshold process where the threshold Vthp of the PMOS transistor 111 is low and the threshold Vthn of the NMOS transistor 113 is high.

In the inverter circuit 110, an input logic signal IN is fed to the gates of the PMOS transistor 111 and the NMOS transistor 113. A complementary version of the input logic signal IN is provided as an output signal OUT from a drain-connected node of the inverter circuit. When the input logic signal IN is a "low" logic state, standby current is reduced in a standby period, because of the high threshold Vthn of the NMOS transistor 113. However, such conventional dual threshold scheme has a drawback. When the input logic signal IN transitions from "low" logic state to "high" logic state, it causes a longer propagation delay.

FIG. 1B shows a CMOS inverter chain, as another example of conventional semiconductor ICs. Referring to FIG. 1 B, a CMOS inverter chain includes four inverters 121-124 with power switching PMOS and NMOS transistors 131 and 133. Each of the inverters 121 and 123 includes PMOS and NMOS transistors that are connected in series between a power supply line of high level voltage VDD and a virtual ground line of low level voltage VSSi. Each of the other inverters 122 and 124 includes PMOS and NMOS transistors that are connected in series between a virtual power supply line of high level voltage VDDi and a ground line of low level voltage VSS. The PMOS transistor 131 is connected between the power supply line (VDD) and the virtual power supply line (VDDi). The NMOS transistor 133 is connected between the virtual ground line (VSSi) and the ground line (VSS).

An input logic signal IN is fed to the gates of the PMOS and NMOS transistors of the first inverter 121. An output signal from the first inverter 121 is provided to the gates of the PMOS and NMOS transistors of the second inverter 122. Similarly, an output signal of the second inverter 122 is fed to the third inverter 123, the output signal of which is in turn fed to the fourth inverter 124. Power switch control signals SLEEP and SLEEP_b are fed to the gates of the PMOS and NMOS transistors 131 and 133, respectively. In a power down mode, the input signal IN stays at "low" logic level, and the power switch control signals SLEEP and SLEEP_b hold "high" and "low" logic levels, respectively, in order to shut off the two power switching PMOS and NMOS transistors 131 and 133. Those two control signals SLEEP and SLEEP_b must be generated and controlled in accordance with the external commands, like "power down mode entry" or "self refresh mode entry" in DRAM devices, for example. Therefore, in a normal operation mode, there can be still current leakage paths, because both of the power switching PMOS and NMOS transistors 131 and 133 are on.

U.S. Pat. No. 6,696,865 issued to Horiguchi et al. on Feb. 24, 2004 discloses a semiconductor IC device that is comprised of logic gates, each being provided with at least two MOS transistors. It includes a current control device for controlling a value of current flowing in the logic gate and operates in high and low power consumption modes.

U.S. Pat. No. 5,486,774 issued to Douseki et al. on Jan. 23, 1996 discloses a logic circuit includes a low-threshold logic circuit, a pair of power lines, a dummy power line, and a high-frequency logic circuit. The low-threshold logic circuit has a logic circuit comprised of a plurality of low-threshold MOS transistors. The pair of power lines supply power to the low-threshold logic circuit. The dummy power line is connected to one of power source terminals of the low-threshold logic circuit. The high-threshold control transistor is arranged between the dummy power line and the power line.

M. Horiguchi et al. disclose a switched-source-impedance CMOS circuit in their paper "Switched-Source-Impedance CMOS Circuit for Low Standby Subthreshold Current Giga-Scale LSI's", IEEE Journal of Solid-State Circuits, Vol. 28, No. 11, Novembeer 1993, pp. 1131-1135. In the CMOS circuit, a switched impedance element is inserted between the sources of MOS transistors and power lines to reduce the standby subthreshold currents.

The circuits disclosed in these documents use the specific "power saving mode" signals, like "SLEEP" and "SLEEP_b" or "CS" and "CS_b", when power saving is specially required in the specific mode which is called by "sleep", "power-down", "self-refresh" or "standby" mode, for example. In the normal operation mode, there are still current leakage paths, resulting in current leakages and great total active power consumption.

SUMMARY OF THE INVENTION

It is an object of the present invention to provide an improved semiconductor IC capable of operating with low power consumption.

In accordance with one aspect of the present invention, there is provided a semiconductor integrated circuit (IC) operated with "high" and "low" logic level voltages. The semiconductor IC includes: a logic gate circuit for providing an output logic signal in response to at least one input logic signal; a control circuit for providing a feedback control signal in response to the output logic signal; and a power gating circuit for gating power to the logic gate in response to the feedback control signal.

For example, the control circuit provides the feedback control signal in response to the output logic signal and an additional input logic signal that is derived from the input logic signal with different logic transition timing. The logic gating circuit includes a logic circuit for performing an inverting function (i.e., in inverter) or a logic function to logically combine a plurality of logic signals. Examples of the logic gate are AND, OR, NAND, NOR and Exclusive-OR logic circuits. The power gate includes a field effect transistor (FET), the source-drain of which is inserted between the logic gate and an input of operating power voltage.

Advantageously, the logic gating circuit may include a CMOS inverter having a first PMOS transistor and a first NMOS transistor that are series-coupled. A first input logic signal is provided to the gates of the series-coupled first PMOS and NMOS transistors, the coupled node of which provides an output logic signal that is a complementary version of the input logic signal. A feedback signal derived from the output logic signal is provided to the inverter to control the operation thereof. The power gating circuit may include a second NMOS transistor, the drain of which is coupled to the source of the first NMOS transistor. The low power level voltage is provided to the source of the second NMOS transistor. The high power level voltage is provided to the source of the first PMOS transistor, the gate of the second NMOS transistor responding to the feedback signal.

For example, the feedback signal is a combination of output of the CMOS inverter and an additional input logic signal that has an earlier transition than the input logic signal. With the feedback signal, a self leakage reduction function is performed for an off transistor of the NMOS and PMOS transistors of the CMOS inverter. Thus, the leakage path current is suppressed and there is no need to have special "power saving" signals. It can reduce leakage current in active operation mode as well as standby mode. Therefore, the semiconductor IC is capable of operating at high speed and with low power consumption even when the semiconductor IC is not in the specific power down mode.

Advantageously, the control circuit may include a logic gate for providing the feedback signal in response to the output logic signal and a second input logic signal. For example, the second input logic signal is a complementary version of the first input logic signal. The rising transition of the first input logic signal is later than the falling transition of the second input signal by a time interval. The logic gate includes a NAND gate for providing the feedback signal in response to the output logic signal and the second input logic signal.

Advantageously, the power gating circuit may include a second PMOS transistor, the drain of which is coupled to the source of the first PMOS transistor. The high power level voltage is provided to the source of the second PMOS transistor. The gate of the second PMOS transistor responds to the feedback signal. Also, the control circuit may include a logic gate for providing the feedback signal in response to the output logic signal and a second input logic signal. For example, the second input logic signal is a complementary version of the first input logic signal. The logic level transition timings of the first and second logic are different by the time interval.

The power gating circuit may further include a second NMOS transistor and a second PMOS transistor that are series-coupled with the first NMOS transistor and the first PMOS transistor between the high and low power level voltages. For example, the feedback signal includes first and second feedback signals. The gate of the second NMOS transistor responds to the first feedback signal and the gate of the second PMOS transistor responds to the second feedback signal.

In accordance with another aspect of the present invention, there is provided a semiconductor integrated circuit operated with high and low power voltages. The semiconductor IC includes a chain of a plurality of CMOS inverters that are coupled through intermediate nodes. The semiconductor IC responds to an input logic signal and provides an output logic signal. The chain includes at least first and second CMOS inverters, each of them having a first PMOS transistor and a first NMOS transistor that are series-coupled. In the chain, a first intermediate input logic signal corresponding to the input logic signal is provided to the gates of the series-coupled first PMOS and NMOS transistors of the first CMOS inverter, the coupled node of which provides a first intermediate output logic signal that is a complementary version of the first intermediate input logic signal. A first feedback signal derived from the first intermediate output logic signal is provided to the first CMOS inverter to control the operation of the inverter. The first intermediate output logic signal is provided to the gates of the series-coupled first PMOS and NMOS transistors of the second CMOS inverter, the coupled node of which provides a second intermediate output logic signal that is a complementary version of the first intermediate output logic signal. A second feedback signal derived from the second intermediate output logic signal is provided to the second CMOS inverter to control the operation of the inverter.

In accordance with a further aspect of the present invention, there is provided a semiconductor integrated circuit operated with high and low power level voltages. The semiconductor IC includes a chain of a plurality of CMOS inverters coupled through intermediate nodes. The chain includes first and second CMOS inverters. The semiconductor IC responds to an input logic signal and provides an output logic signal. Each of the first and second CMOS inverters includes a first PMOS transistor and a first NMOS transistor that are series-coupled. It further includes: a second NMOS transistor, the drain of which is coupled to the source of the first NMOS transistor; and a second PMOS transistor, the drain of which is coupled to the source of the first PMOS transistor. In the semiconductor integrated circuit (IC), the drain of the second NMOS transistor is coupled to the source of the first NMOS transistor, the drain of the second PMOS transistor being coupled to the source of the first PMOS transistor, the low power level voltage being provided to the source of the second NMOS transistor, the high power level voltage being provided to the source of the second PMOS transistor. Furthermore, a first intermediate input logic signal corresponding to the input logic signal is provided to the gates of the series-coupled first PMOS and NMOS transistors of the first CMOS inverter, the coupled node of which provides a first intermediate output logic signal that is a complementary version of the first intermediate input logic signal. First and second feedback signals derived from the first intermediate output logic signal are provided to the first CMOS inverter to control the operation of the inverters.

The present invention generally relates to semiconductor ICs and in particular to low power ICs. The present invention uses a feedback scheme to reduce the leakage current, so there is no need to have special "power saving" signals, and can reduce leakage current in active operation mode as well as standby mode.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the accompanied drawings wherein:

FIG. 1A illustrates a circuit of a conventional CMOS inverter using dual threshold voltage transistors;

FIG. 1B illustrates a circuit of a conventional CMOS inverter chain using power-switching transistors;

DETAILED DESCRIPTION

In the following detailed description of sample embodiments of the invention, reference is made to the accompanying drawings which form a part hereof, and in which is shown by way of illustration specific sample embodiments in which the present invention may be practiced. These embodiments are described in sufficient detail to enable those skilled in the art to practice the present invention, and it is to be understood that other embodiments may be utilized and that logical, mechanical, electrical, and other changes may be made without departing from the scope of the present invention. The following detailed description is, therefore, not to be taken in a limiting sense, and the scope of the present invention is defined by the appended claims.

Generally, the present invention provides semiconductor integrated circuits with low power consumption. The present invention is applicable to any type of logic gates.

Figure 2A:
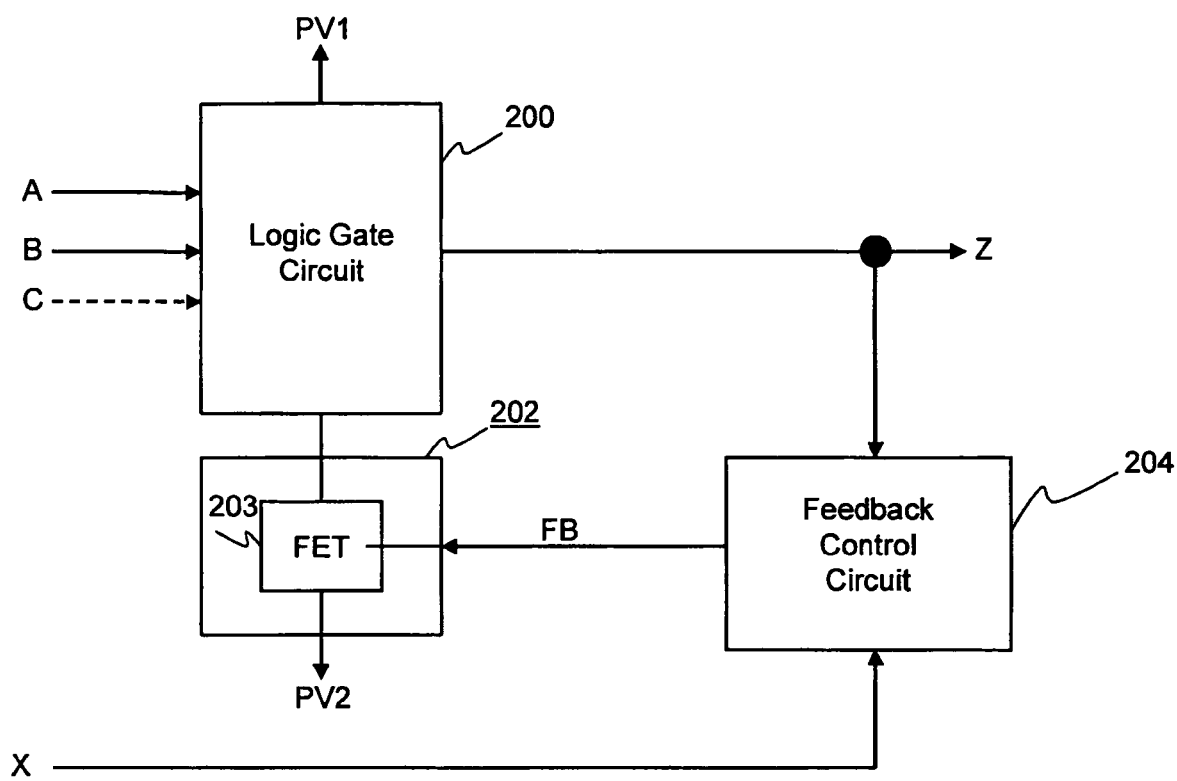
FIG. 2A illustrates a semiconductor integrated circuit (IC) in accordance with one aspect of the present invention.

FIG. 2A illustrates one aspect of the present invention. Referring to FIG. 2A, a semiconductor integrated circuit (IC), operated with first and second power supply voltages PV1 and PV2, includes a logic gate circuit 200, a power gating circuit 202 and a feedback control circuit 204. One input logic signal or a plurality of input logic signals are fed to the logic gate circuit 200 which in turn provides an output logic signal in accordance with the logic function thereof. The feedback control circuit 204 is provided with an additional input logic signal X that is related to the input logic signal (e.g., a complementary version of the input logic signal, with different transition timing).

In a case where the logic function of the logic gate circuit 200 is a logical inversion, the single input logic signal, for example, signal A is inverted to provide the output logic signal Z which is a complementary or inverted version of the input signal A. In a case where the logic function is another type of logic function (e.g., NAND, NOR, Exclusive-OR, AND, OR), a plurality of input signals having at least two logic signals are provided to the logic gate circuit 200 and the output logic signal Z is the logically combined output of the input logic signals. In response to the output logic signal Z and the additional input logic signal X, the feedback control circuit 204 provides a feedback signal FB to the power gating circuit 202.

The power gating circuit 202 is comprised of a switching element (e.g., a field effect transistor (FET)) 203 for gating or switching power to logic function circuits (not shown) of the logic gate circuit 200. The FET 203 may be an NMOS transistor for gating low level voltage VSS as the second power voltage PV2 or a PMOS transistor for gating high level voltage VDD as the first power voltage PV1. With the power gating circuit 202 responding to the output logic signal Z, the semiconductor IC performs a self leakage reduction, i.e., leakage current is reduced significantly since the leakage path between the two power supplies PV1 and PV2 via logic gate circuit 200 is broken.

The present invention is applicable to any groups of logic gates (e.g., NAND, NOR, Exclusive-OR, AND, OR). However, a case of an inverter will be described herein for the sake of simplicity.

Figure 2B:
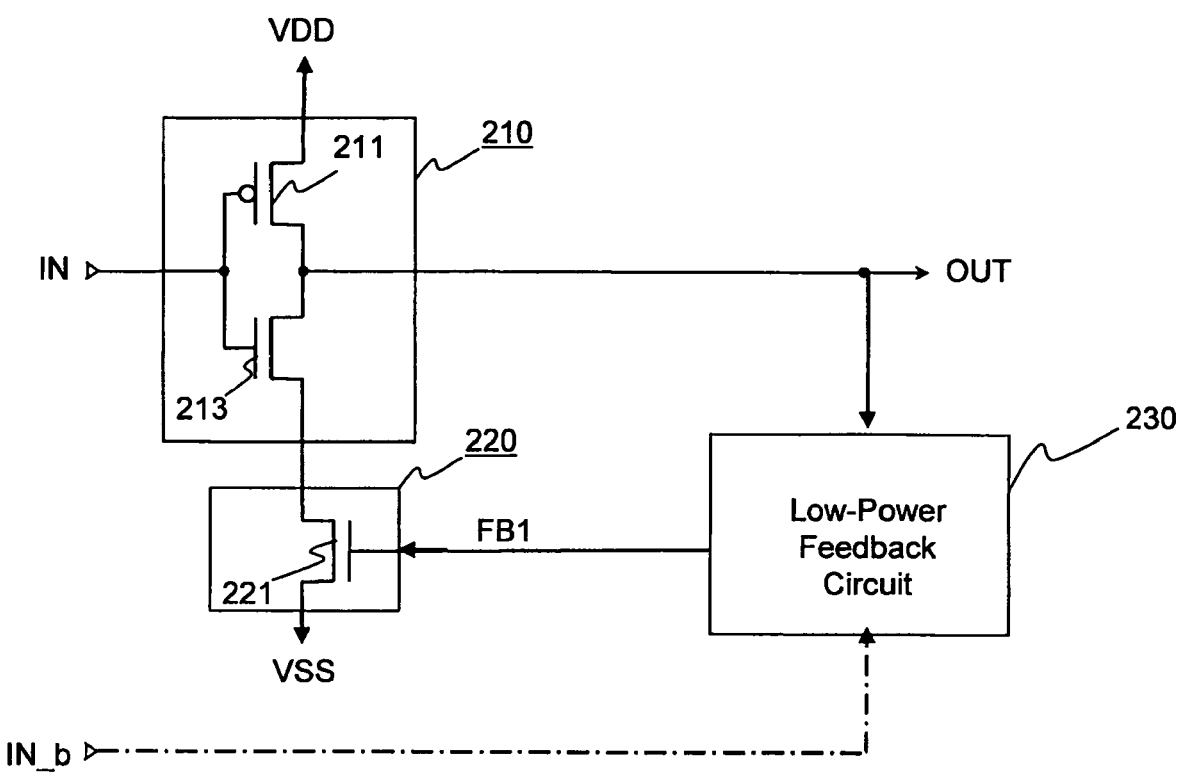
FIG. 2B illustrates a semiconductor IC in accordance with another aspect of the present invention.

FIG. 2B shows another aspect of the present invention. Referring to FIG. 2B, a semiconductor IC includes an inverter logic circuit 210, a low-power gating circuit 220 and a low-power feedback circuit 230. The inverter logic circuit 210 includes series-connected PMOS transistor 211 and NMOS transistor 213. An input logic signal IN is provided to the gates of the PMOS transistor 211 and the NMOS transistor 213. An output logic signal OUT is provided from a coupled node of the drains of the PMOS transistor 211 and the NMOS transistor 213. The output logic signal OUT is a complementary version of the input logic signal IN. The output logic signal OUT is provided to the low-power feedback circuit 230 which in turn provides a low-power feedback signal FB1 to the low-power gating circuit 220. The low-power gating circuit 220 includes a gating element 221 that is turned on and off in response to the low-power feedback signal FB1. The source of the NMOS transistor 213 is coupled to a power source of low level voltage VSS through the gating element 221. The source of the PMOS transistor 211 is coupled to another power source of high level voltage VDD. An example of the gating element 221 is an NMOS transistor, the gate of which is controlled by the low-power feedback signal FB1. Ideally, the gating element 221 is conductive and non-conductive when the low-power feedback signal FB1 is "high" logic level and "low" logic level, respectively. However, leakage current flows in the NMOS transistor 221 while it is in the off state.

The semiconductor IC is operated with the high and low level power supply voltages VDD and VSS. When the input logic signal IN is "low", the PMOS transistor 211 is "on" and the output logic signal OUT is "high". In response to the output logic signal OUT being "high", the low-power feedback signal FB1 from the low-power feedback circuit 230 is "low", so that the gating element 221 is turned off and a current path of the NMOS transistor 213 is cut off. Thus, when the input logic signal IN is "low", by feedback of the output logic signal OUT, a current leak through the NMOS transistor 213 of the inverter logic circuit 210 is prevented by the low-power gating circuit 220.

When the input logic signal IN is "high", the PMOS transistor 211 is "off" and the output logic signal OUT is "low". In response to the output logic signal OUT being "low", the low-power feedback signal FB1 from the low-power feedback circuit 230 is "high", so that the gating element 221 is turned on and a current path of the NMOS transistor 213 is established.

In another example, the low-power feedback signal FB1 is produced in response to the output logic signal OUT and another input logic signal IN_b that is a complementary version of the input logic signal IN. Transition timing of the complementary input logic signal IN_b is different from that of the input logic signal IN. The complementary input logic signal IN_b and the output logic signal OUT are logically combined by the low-power feedback circuit 230 (that is comprised of a logic gate, for example) that produces a logically combined signal as the low-power feedback signal FB1. Dependent upon the time difference in transition timing between the complementary input logic signal IN_b and the input logic signal IN, the turn-off period of the low-power gating circuit 220 (the gating element 221) is adjusted.

Figure 2C:
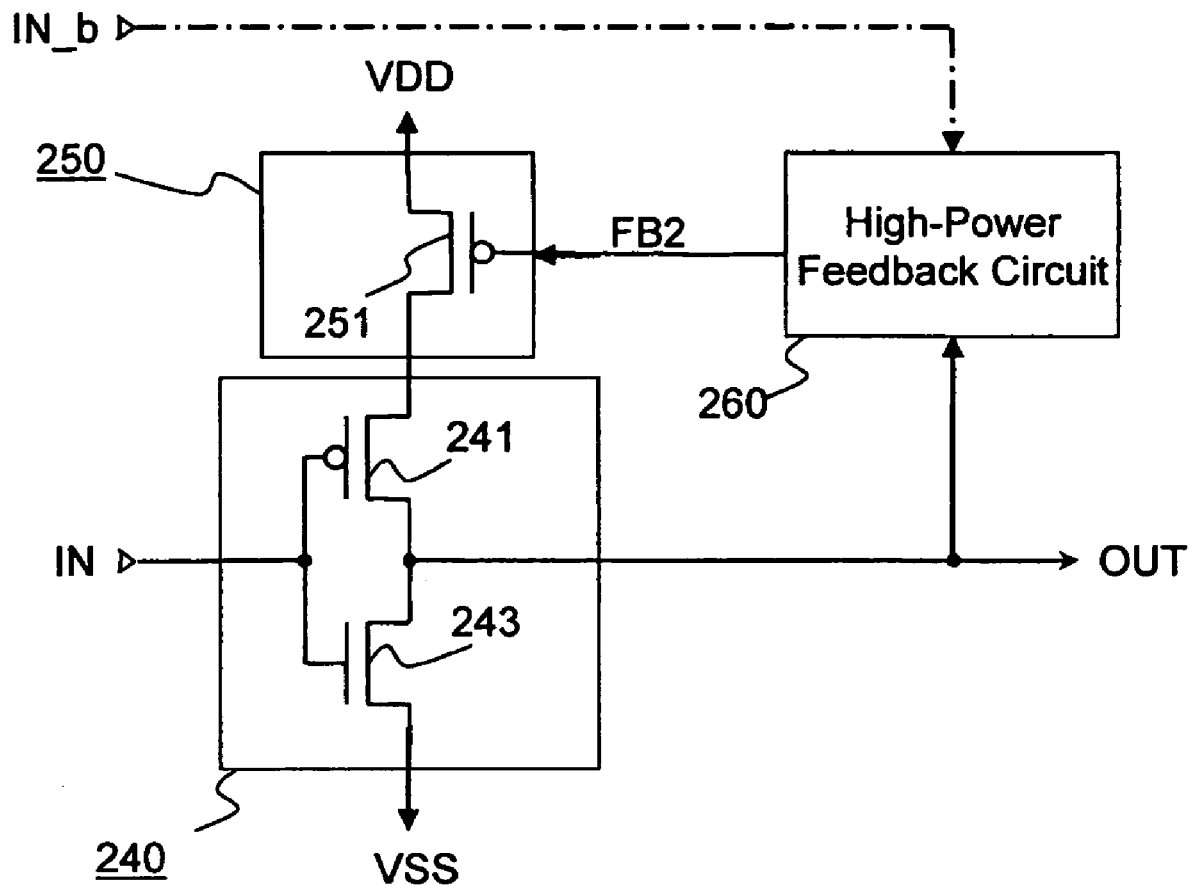
FIG. 2C illustrates a semiconductor IC in accordance with a further aspect of the present invention.

FIG. 2C shows another aspect of the present invention. Referring to FIG. 2C, a semiconductor IC includes an inverter logic circuit 240, a high-power gating circuit 250 and a high-power feedback circuit 260. The inverter logic circuit 240 includes series-connected PMOS transistor 241 and NMOS transistor 243. An input logic signal IN is provided to the gates of the PMOS transistor 241 and the NMOS transistor 243. An output logic signal OUT is provided from a coupled node of the drains of the PMOS transistor 241 and the NMOS transistor 243. The output logic signal OUT is a complementary version of the input logic signal IN. The output logic signal OUT is provided to the high-power feedback circuit 260 which in turn provides a high-power feedback signal FB2 to the high-power gating circuit 250. The high-power gating circuit 250 includes a gating element 251 that is turned on and off in response to the high-power feedback signal FB2. The source of the PMOS transistor 243 is coupled to a power source of high level voltage VDD through the gating element 251. The source of the NMOS transistor 243 is coupled to another power source of low level voltage VSS. An example of the gating element 251 is a PMOS transistor, the gate of which is controlled by the high-power feedback signal FB2. Ideally, the gating element 251 is conductive and non-conductive when the high-power feedback signal FB2 is "low" and "high", respectively. However, leakage current flows in the PMOS transistor 251 while it is in the off state.

The semiconductor IC is operated with the high and low level voltages VDD and VSS. When the input logic signal IN is "high", the NMOS transistor 243 is "on" and the output logic signal OUT is "low". In response to the output logic signal OUT being low, the high-power feedback signal FB2 from the high-power feedback circuit 260 is "high", so that the gating element 251 is turned off and a current path of the PMOS transistor 241 is cut-off. Thus, when the input logic signal IN is "high", by feedback of the output logic signal OUT, a current leak through the PMOS transistor 241 of the inverter logic circuit 240 is prevented by the high-power gating circuit 250.

When the input logic signal IN is "low", the PMOS transistor 241 is "on" and the output logic signal OUT is "high". In response to the output logic signal OUT being "high", the high-power feedback signal FB2 from the high-power feedback circuit 260 is "low", so that the gating element 251 is turned on and a current path of the PMOS transistor 241 is established.

In another example, the high-power feedback signal FB2 is produced in response to the output logic signal OUT and another input logic signal IN_b that is a complementary version of the input logic signal IN. Transition timing of the complementary input logic signal IN_b is different from that of the input logic signal IN. The complementary input logic signal IN_b and the output logic signal OUT are logically combined by the high-power feedback circuit 260 (that is comprised of a logic gate, for example) that produces a logically combined signal as the high-power feedback signal FB2. Dependent upon the time difference in transition timing between the complementary input logic signal IN_b and the input logic signal IN, the turn-off period of the high-power gating circuit 250 (the gating element 251) is adjusted.

Figure 2D:
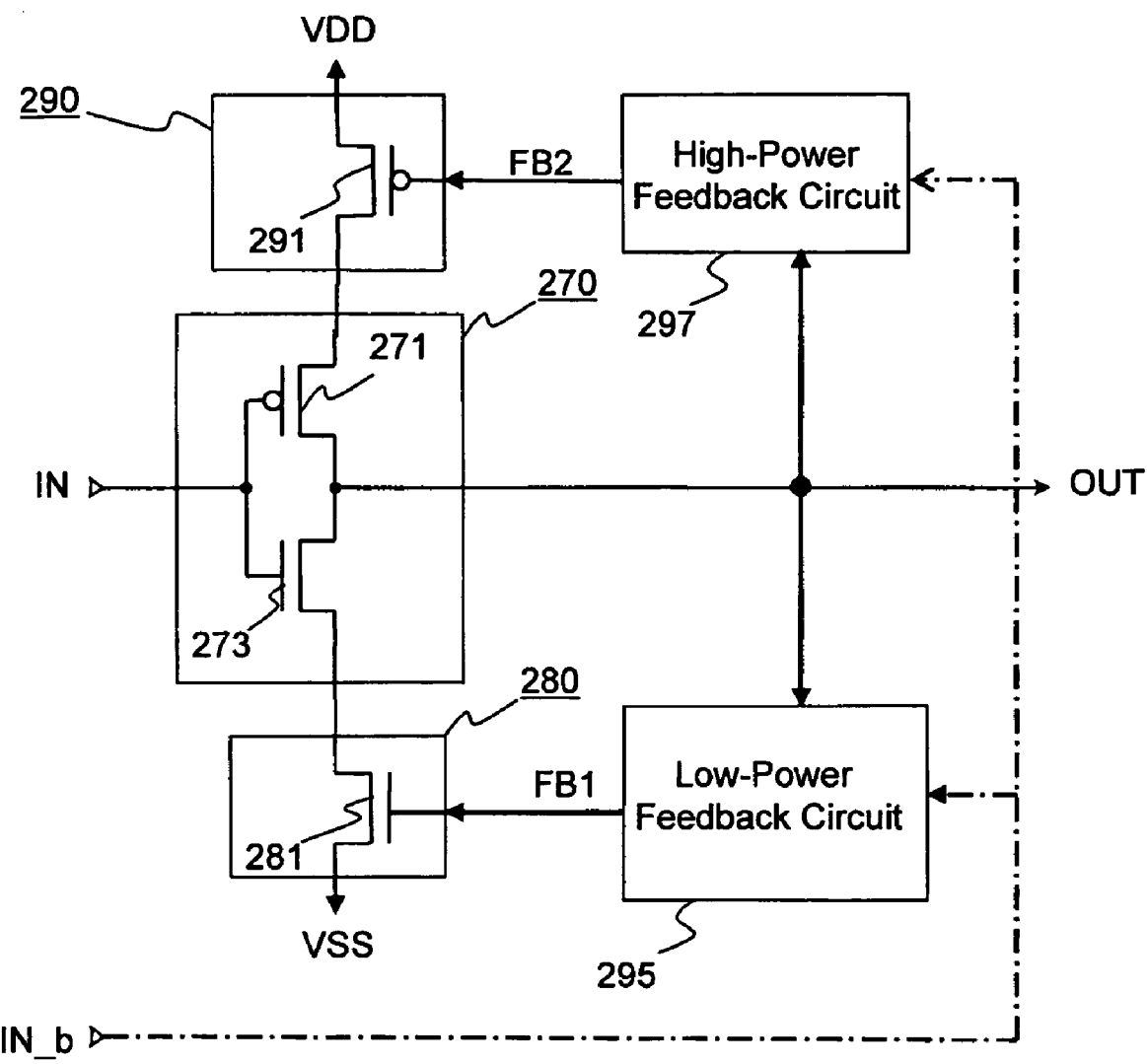
FIG. 2D illustrates a semiconductor IC in accordance with a yet further aspect of the present invention.

FIG. 2D shows another aspect of the present invention. Referring to FIG. 2D, a semiconductor IC includes an inverter logic circuit 270, a low-power gating circuit 280, a high-power gating circuit 290, a low-power feedback circuit 295 and a high-power feedback circuit 297. The inverter logic circuit 270 includes series-connected PMOS transistor 271 and NMOS transistor 273. An input logic signal IN is provided to the gates of the PMOS transistor 271 and the NMOS transistor 273. An output logic signal OUT is provided from a coupled node of the drains of the PMO transistor 271 and the NMOS transistor 273. The output logic signal OUT is a complementary version of the input logic signal IN. The output logic signal OUT is provided to the low-power feedback circuit 295 which in turn provides a low-power feedback signal FB1 to the low-power gating circuit 280. Also, the output logic signal OUT is provided to the high-power feedback circuit 297 which in turn provides a high-power feedback signal FB2 to the high-power gating circuit 290.

The low-power gating circuit 280 includes a gating element 281 that is turned-on and -off in response to the low-power feedback signal FB1. The source of the NMOS transistor 273 is coupled to a power source of low level voltage VSS through the gating element 281. The high-power gating circuit 290 includes a gating element 291 that is turned on and off in response to the high-power feedback signal FB2. The source of the PMOS transistor 271 is coupled to a power source of high level voltage VDD through the gating element 291. The source of the PMO transistor 271 is coupled to another power source of "high" logic level voltage VDD.

Examples of the gating elements 281 and 291 are NMOS and PMOS transistors, respectively, the gates of which are controlled by the low-power and high-power feedback signals FB1 and FB2, respectively. Ideally, the gating element 281 is conductive and non-conductive when the low-power feedback signal FB1 is "high" and "low", respectively. Similarly, ideally, the gating element 291 is conductive and non-conductive when the high-power feedback signal FB2 is "low" and "high", respectively. However, leakage current flows in each of the NMOS and PMOS transistors while it is in the off state.

The semiconductor IC is operated with the high and low level voltages VDD and VSS. When the input logic signal IN is "low", the PMOS transistor 271 is "on" and the output logic signal OUT is "high". In response to the output logic signal OUT being "high", the low-power feedback signal FB1 from the low-power feedback circuit 295 is "low", so that the gating element 281 is turned off and a current path of the NMOS transistor 273 is cut-off. Thus, when the input logic signal IN is "low", by feedback of the output logic signal OUT, a current leak through the NMOS transistor 273 of the inverter logic circuit 270 is prevented by the low-power gating circuit 280. In response to the output logic signal OUT being "high", the high-power feedback signal FB2 from the high-power feedback circuit 297 is "low", so that the gating element 291 is turned on and a current path of the PMOS transistor 271 is established.

When the input logic signal IN is "high", the NMOS transistor 273 is "on" and the output logic signal OUT is "low". In response to the output logic signal OUT being "low", the high-power feedback signal FB2 from the high-power feedback circuit 297 is "high", so that the gating element 291 is turned off and a current path of the PMOS transistor 271 is cut-off. Thus, when the input logic signal IN is "high", by feedback of the output logic signal OUT, a current leak through the PMOS transistor 271 of the inverter logic circuit 270 is prevented by the high-power gating circuit 290. In response to the output logic signal OUT being "low", the low-power feedback signal FB1 from the low-power feedback circuit 295 is "high", so that the gating element 281 is turned on and a current path of the NMOS transistor 273 is established.

In another example, the low-power feedback signal FB1 is produced in response to the output logic signal OUT and another input logic signal IN_b that is a complementary version of the input logic signal IN. Also, the high-power feedback signal FB2 is produced in response to the output logic signal OUT and the complementary input logic signal IN_b. Transition timing of the complementary input logic signal IN_b is different from that of the input logic signal IN. The complementary input logic signal IN_b and the output logic signal OUT are logically combined by the low-power feedback circuit 295 (that is comprised of a logic gate, for example) that produces a logically combined signal as the low-power feedback signal FB1. Dependent upon the time difference in transition timing between the complementary input logic signal IN_b and the input logic signal IN, the turn-off period of the low-power gating circuit 280 (the gating element 281) is adjusted. Similarly, the complementary input logic signal IN_b and the output logic signal OUT are logically combined by the high-power feedback circuit 297 (that is comprised of a logic gate, for example) that produces a logically combined signal as the high-power feedback signal FB2. Dependent upon the time difference in transition timing between the complementary input logic signal IN_b and the input logic signal IN, the turn-off period of the high-power gating circuit 290 (the gating element 291) is adjusted.

The low-power feedback circuit 230 shown in FIG. 2B, the high-power feedback circuit 260 shown in FIG. 2C and the low-power feedback circuit 295 and the high-power feedback circuit 297 shown in FIG. 2D correspond to the feedback control circuit 204 shown in FIG. 2A.

Figure 3A:
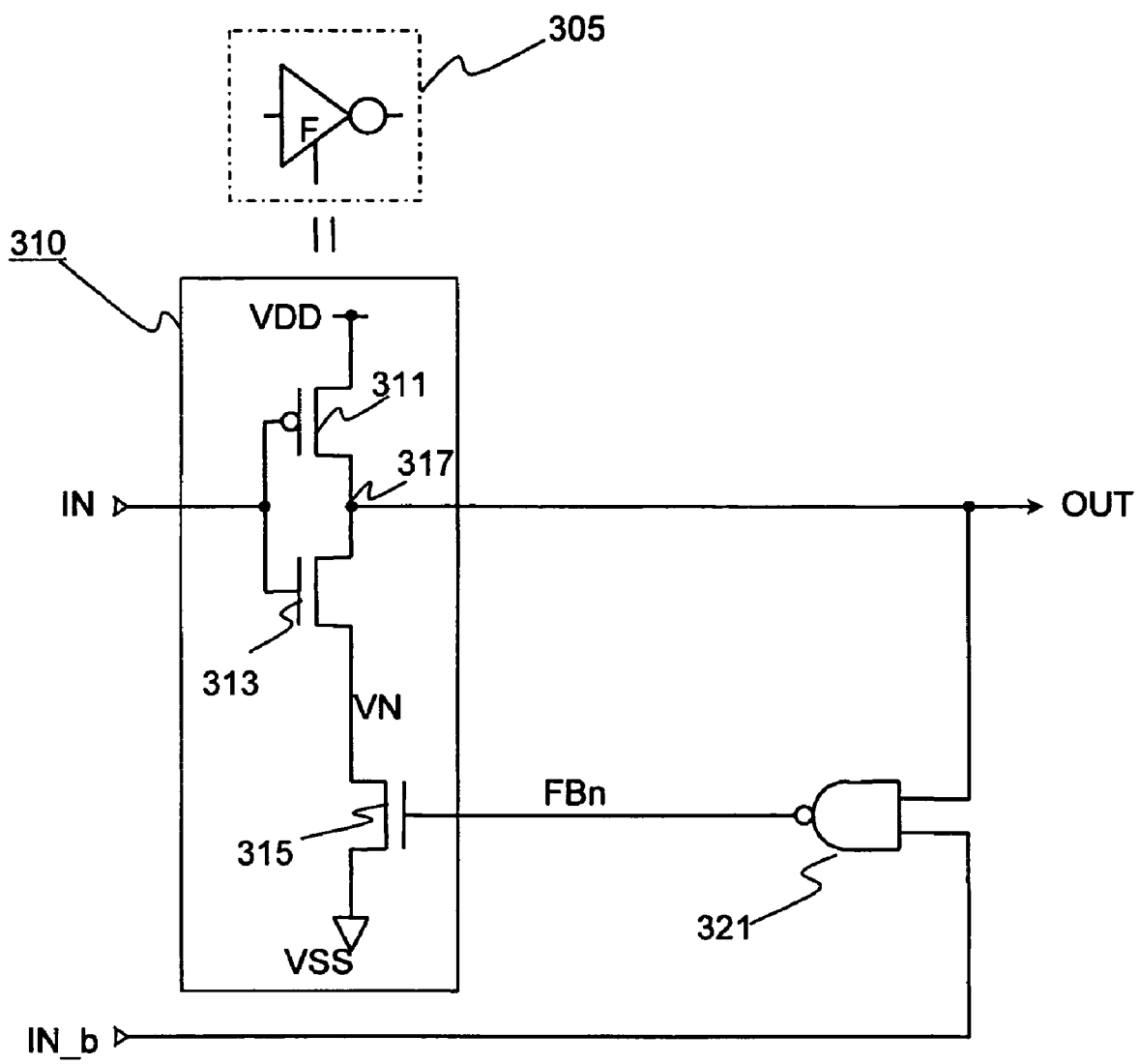
FIG. 3A is a circuit diagram showing a semiconductor IC according to an embodiment of the present invention.

FIG. 3A shows a semiconductor integrated circuit (IC) according to an embodiment of the present invention. The semiconductor IC is a controlled inverter with NMOS power gating transistor and NAND feedback logic gate for controlling NMOS power gating transistor. Referring to FIG. 3A, an inverter logic circuit 310 includes a PMOS transistor 311, an NMOS transistor 313 and additional NMOS transistor 315 which is inserted between the source of the NMOS transistor 313 and a power line of ground level voltage (low level voltage) VSS. A node 317 of the connected drains of the PMOS and NMOS transistors 311 and 313 is connected to a first input of a NAND gate 321, the output of which is connected to the gate of the NMOS transistor 315. The source of the PMOS transistor 311 is connected to a power line of power supply voltage (high level voltage) VDD. An input logic signal IN is fed to the gates of the PMOS and NMOS transistors 311 and 313. Another input logic signal IN_b is fed to a second input of the NAND gate 321. An output logic signal OUT provided from the node 317 is an inverted or complementary version of the input logic signal IN.

The controlled inverter circuit 310 has an associated symbol shown by reference number 305 for the purpose of example. In a low input standby state (i.e., receiving a "low" logic level input), the PMOS transistor 311 and the NMOS transistor 313 of the inverter logic circuit 310 must be "on" and "off", respectively. In a case of the NMOS transistor 313 having a low threshold for high-speed applications for example, even though the NMOS transistor 313 is in the off state, the NMOS transistor 313 will still experience current leakage. In order to effectively reduce the current leakage, reverse biasing of gate-source voltage $V_{GS}$ and bulk-source voltage $V_{BS}$ and reduction of drain-source voltage $V_{DS}$ were required.

In the improved semiconductor IC with the controlled inverter shown in FIG. 3A, the NMOS transistor 315 is added for low-power gating. Also, in the standby state, both of the output logic signal OUT and the complementary input signal IN_b are "high" and the feedback signal FBn from the NAND gate 321 is "low", thereby causing the NMOS transistor 315 being "off". While the NMOS transistor 313 leaks, an intermediate node VN, which is the connected source of the NMOS transistor 313 and drain of the NMOS transistor 315, slightly rises from the ground level VSS by an amount $\Delta V_L$. This voltage rising at the intermediate node VN is continued until the current supplied from the NMOS transistor 315 balances the current flowing in the NMOS transistor 313. Thus, no matter how large the original leakage current in the NMOS transistor 313, it is eventually confined to the constant current of the NMOS transistor 315 by automatic adjustment of the offset voltage $\Delta V_L$ which is given by:

$$\Delta V_L = |V_{TN0}| - |V_{TN1}| + (S/ln10)[ln(W_{N1}/W_{N0})] \quad (1)$$

where:
$V_{TN0}$ is the threshold voltage of the NMOS transistor 315;
$V_{TN1}$ is the threshold voltage of the NMOS transistor 313;
$W_{N0}$ is the channel width of the NMOS transistor 315;
$W_{N1}$ is the channel width of the NMOS transistor 313; and
S is the subthreshold swing.

It Is noted that the leakage current reduction is adjustable by the offset voltage $\Delta V_L$. In a case where $|V_{TN0}|$ is large enough or $W_{N0}$ is small enough, the offset voltage $\Delta V_L$ is large. The result is that leakage current is completely cut off and thus, it creates a perfect switch-off.

In the semiconductor IC shown in FIG. 3A, there is provided a control circuit for controlling the power gating transistor (the NMOS transistor 315). This is accomplished through the dedicated feedback logic signal FBn which is the logical combination of the output of the inverter 310 and a complementary version of input (IN_b) of the input to the inverter.

Figure 3B:
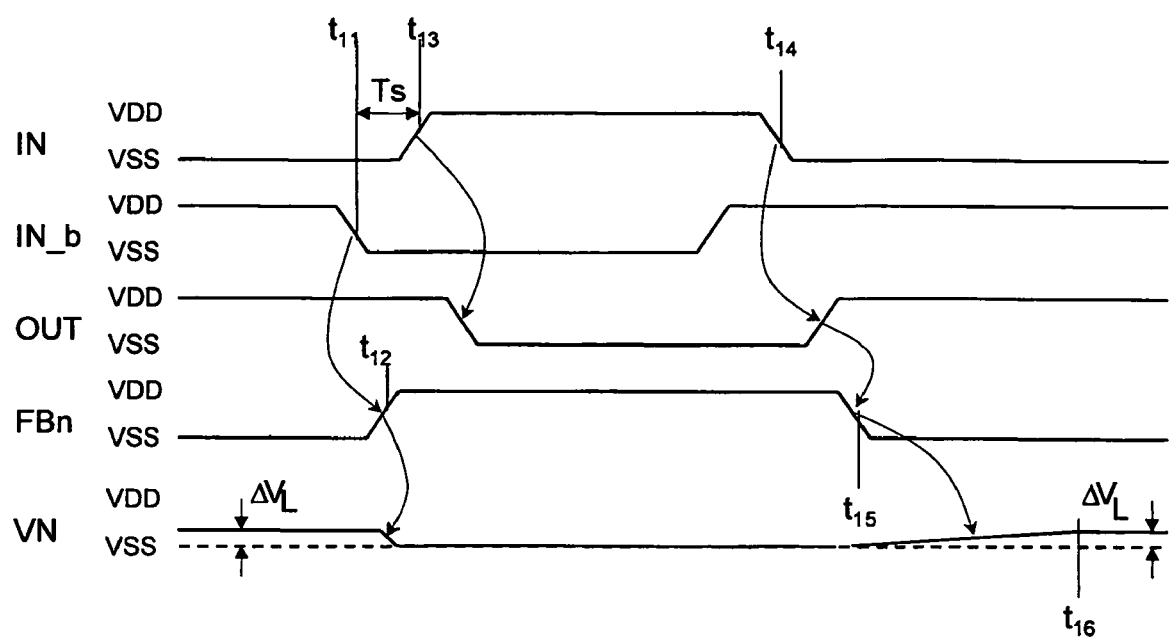
FIG. 3B is a timing sequence diagram showing signals of the semiconductor IC shown in FIG. 3A.

FIG. 3B shows the relative timing sequence for the signals of the semiconductor IC shown in FIG. 3A. It is desirable to turn on the NMOS transistor 315 before the input logic signal IN transitions from the "low" logic state to the "high" logic state, in order to maintain high speed operation of the inverter. Such preset operation is achieved by the NAND gate 321 that logically combines the output logic signal OUT and the complementary input logic signal IN_b. The timing relationship between the input logic signal IN and the complementary input logic signal IN_b is shown in FIG. 3B. As shown, the transition timings of the input logic signal IN are different (they precede transitions in the signal IN) from those of the complementary input logic signal IN_b.

Referring to FIGS. 3A and 3B, the complementary input logic signal IN_b transitions from "high" logic level to "low" logic level at time $t_{11}$, thereby causing the feedback signal FBn from the NAND gate 321 to rise from "low" to "high" logic level. The NMOS transistor 315 is turned on at time $t_{12}$, thereby the intermediate node VN being pulled down to the ground level VSS. Thereafter, at time $t_{13}$ (time interval (setup time) Ts after time $t_{11}$), the input logic signal IN transitions from "low" to "high" logic level. In response to this rising transition, the PMOS transistor 311 is turned off and the NMOS transistor 313 is turned on, with the result that the node 317 is quickly pulled down to the ground level VSS through the two series-connected NMOS transistors 313 and 315, that is, the output logic signal OUT goes "low".

Thereafter, the complementary input logic signal IN_b transitions from "low" to "high" logic level. As the output logic signal OUT is "low", the feedback signal FBn continues to be "high". Then, at time $t_{14}$, the input logic signal IN transitions from "high" to "low" logic level. The PMOS transistor 311 is turned on, thereby the node 317 being pulled up to the "high" logic level, that is, the output logic signal OUT goes "high". In response to the rising of the output logic signal OUT, the feedback signal FBn from the NAND gate 321 goes "low" at time $t_{15}$, with the result that the NMOS transistor 315 is turned off. However, leakage current flows in the NMOS transistors 313 and 315 and the node VN rises. The voltage level at the node VN settles to the level of the offset voltage $\Delta V_L$, as described above with reference to FIG. 3A and eventually, the NMOS transistor 315 automatically shuts off. Hence, the self leakage reduction mechanism is automatically achieved by the feedback path comprising the NAND gate 321.

The leakage portion of total power consumption in sub-100 nm technologies (90 nm, 65 nm, 45 nm etc.) is becoming increasingly important. Therefore, current leakage reduction has an important impact when the MOS transistors are very leaky even in the off state during normal operating modes, i.e., not power saving mode set by a specific power-down mode or the self-refresh or sleep mode commands.

Figure 4A:
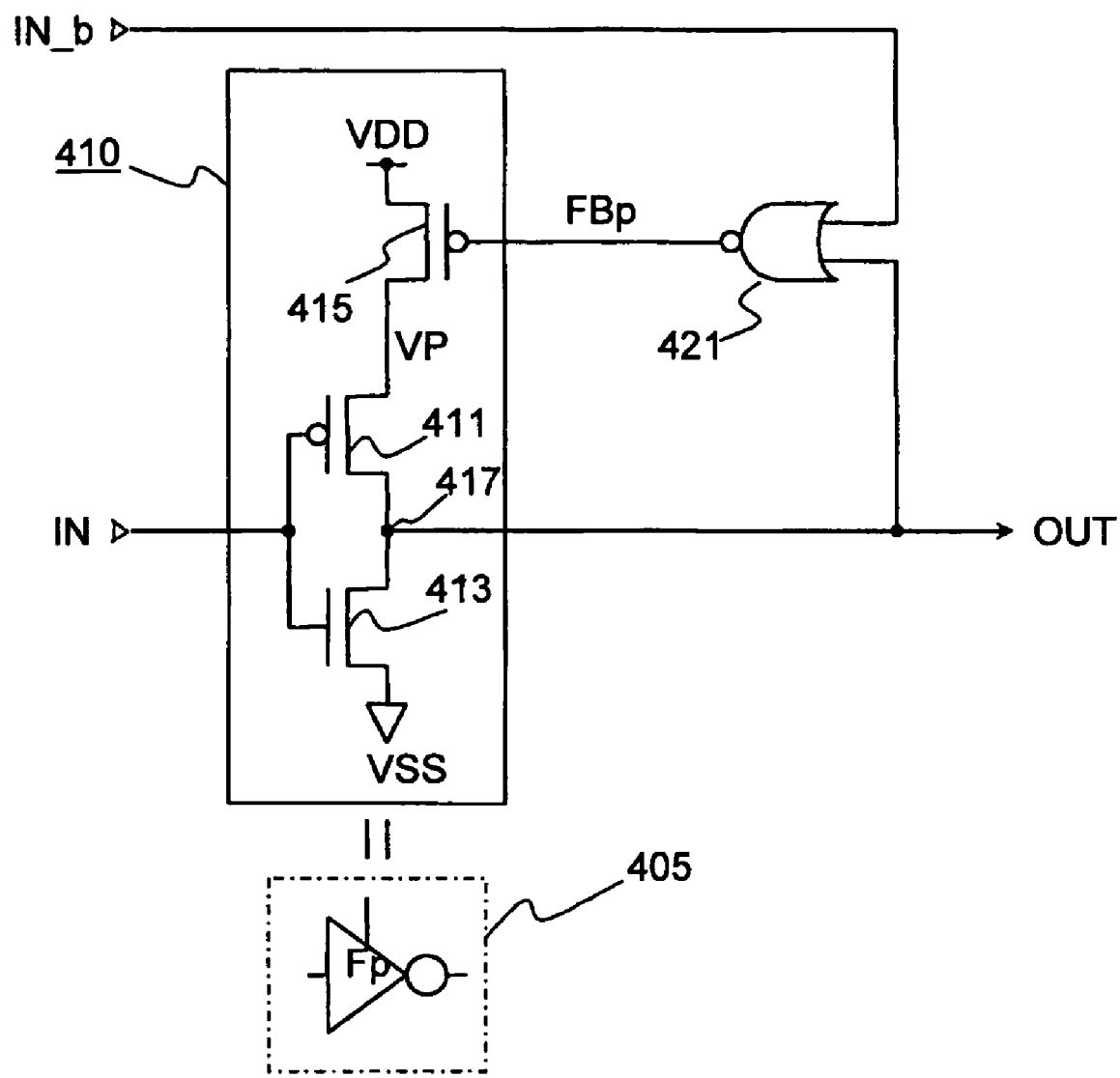
FIG. 4A is a circuit diagram showing a semiconductor IC according to another embodiment of the present invention.

FIG. 4A shows a semiconductor IC according to another embodiment of the present invention. The semiconductor IC is a controlled inverter with a PMOS power gating transistor and a NOR feedback logic circuit for controlling the PMOS power gating transistor.

In the semiconductor IC shown in FIG. 4A, a controlled inverter logic circuit 410 includes a PMOS transistor 411, an NMOS transistor 413 and additional PMOS transistor 415 which is inserted between the source of the PMOS transistor 411 and a power line of power supply level voltage VDD. A node 417 of the connected drains of the PMOS and NMOS transistors 411 and 413 is connected to a first input of a NOR gate 421, the output of which is connected to the gate of the PMOS transistor 415. The source of the NMOS transistor 413 is connected to a power line of ground level voltage VSS. An input logic signal IN is fed to the gates of the PMOS and NMOS transistors 411 and 413. Another input logic signal IN_b that is a complementary version of the input logic signal IN is fed to a second input of the NOR gate 421. An output logic signal OUT provided from the node 417 is an inverted or complementary version of the input logic signal IN.

The controlled inverter logic circuit 410 has an associated symbol shown by reference number 405 for the purpose of example. The gate of the PMOS transistor 415 is controlled in response to a feedback signal FBp from the NOR gate 421 that receives the output logic signal OUT and the complementary input logic signal IN_b.

In the "high" logic level input state, the PMOS and NMOS transistors 411 and 413 of the semiconductor IC are off and on, respectively. In a case of the PMOS transistor 411 having a low threshold, even though the PMOS transistor 411 is in the off state, it causes large current leakage. In order to effectively reduce the current leakage, reverse biasing of gate-source voltage $V_{GS}$ and base-source voltage $V_{BS}$ and reduction of drain-source voltage $V_{DS}$ are required.

In the semiconductor IC shown in FIG. 4A, the PMOS transistor 415 is added for high-power gating. Also, in the standby state, both of the output logic signal OUT and the complementary input signal IN_b are "low" and the feedback signal FBp from the NOR gate 421 is "high", thereby the PMOS transistor 415 being turned off. While the PMOS transistor 411 leaks, an intermediate node VP (which is the connected source of the PMOS transistor 411 and drain of the PMOS transistor 415) slightly rises from the power supply level VDD by an amount $\Delta V_L$. This voltage rising at the intermediate node VP is continued until the current supplied from the PMOS transistor 415 balances the current flowing in the PMOS transistor 411. Thus, no matter how large the original leak current in the PMOS transistor 411, it is eventually confined to the constant current of the PMOS transistor 415 by automatic adjustment of the offset voltage $\Delta V_L$ which is given by:

$$\Delta V_L = V_{TP0} - V_{TP1} + (S/\ln 10)[\ln(W_{P1}/W_{P0})] \quad (2)$$

where:

$V_{TP0}$ is the threshold voltage of the PMOS transistor 415;
$V_{TP1}$ is the threshold voltage of the PMOS transistor 411;
$W_{P0}$ is the channel width of the PMOS transistor 415;
$W_{P1}$ is the channel width of the PMOS transistor 411; and
S is the subthreshold swing.

It is noted that the leakage current reduction is adjustable by the offset voltage $\Delta V_L$. In a case where $V_{TP0}$ is large enough or $W_{P0}$ is small enough, the offset voltage $\Delta V_L$ is large. The result is that leakage current is completely cut off and thus, it creates a perfect switch-off.

Figure 4B:
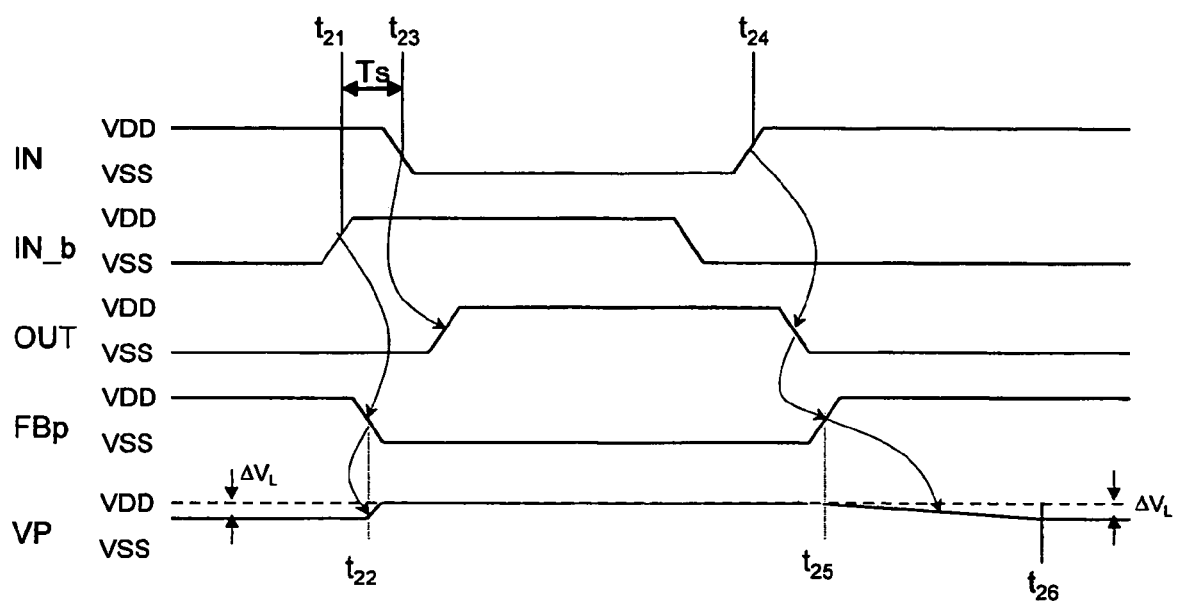
FIG. 4B is a timing sequence diagram showing signals of the semiconductor IC shown in FIG. 4A.

FIG. 4B shows the relative timing sequence for the signals of the semiconductor IC shown in FIG. 4A. The timing relationship between the input logic signal IN and the complementary input logic signal IN_b is shown in FIG. 4B. In order to maintain high speed operation of the inverter, it is desirable to turn on the PMOS transistor 415 for power gating, before the input signal IN transitions from "high" logic level state to "low" logic level. This preset operation is achieved by the NOR gate 421 which logically combines the output logic signal OUT and the complementary input logic signal IN_b.

Referring to FIGS. 4A and 4B, the complementary input logic signal IN_b transitions earlier than the input logic signal IN by time interval Ts. Therefore, the earlier "low"-"high" transition of the complementary input logic signal IN_b at time $t_{21}$ makes the feedback signal FBp go "low" at time $t_{22}$ and it turns PMOS transistor on. Then, at time $t_{23}$ the input logic signal IN transitions from "high" to "low", so that the output logic signal OUT goes "high" quickly through the two series-connected PMOS transistors 411 and 415. After this active state of the inverter, the input logic signal IN goes "high" again at time $t_{24}$, while the complementary input logic signal IN_b already "low" with the result that the output logic signal OUT goes "low" and the feedback signal FBp goes "high" (at time $t_{25}$). This standby "high" state of the feedback signal FBp shuts off the PMOS transistor 415 automatically, since the node VP is slightly lowered and settles at time $t_{26}$ to the level of the offset voltage $\Delta V_L$, as described above with reference to FIG. 4A. This automatic current leakage reduction is achieved by the feedback path comprising the NOR gate 421.

Figure 5A:
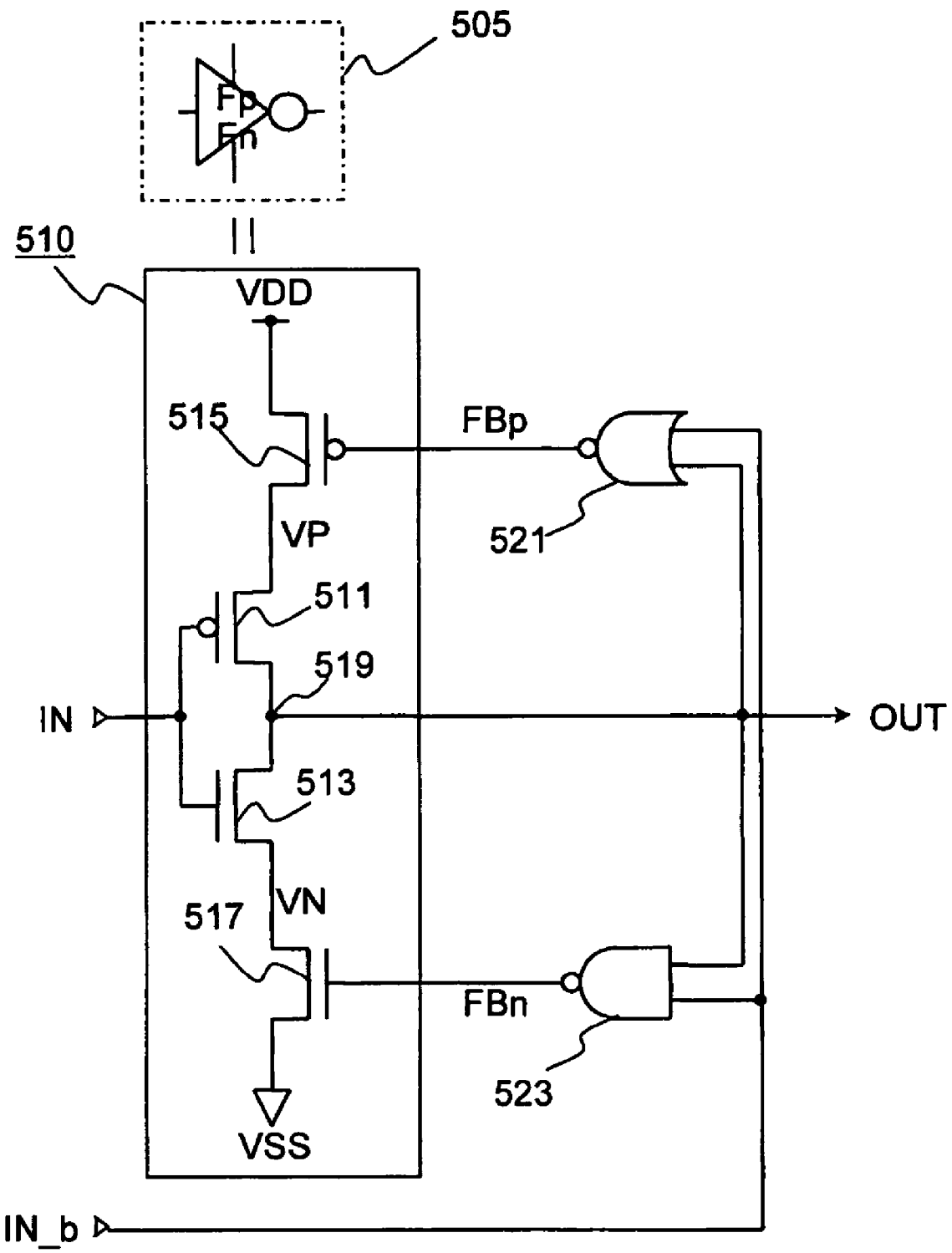
FIG. 5A is a circuit diagram showing a semiconductor IC according to another embodiment of the present invention.

FIG. 5A shows a semiconductor integrated circuit (IC) according to another embodiment of the present invention. The semiconductor IC is a controlled inverter with a PMOS power gating transistor and a NOR feedback logic for controlling the PMOS power gating transistor, and with an NMOS power gating transistor and a NAND feedback logic for controlling the NMOS power gating transistor. The semiconductor IC shown in FIG. 5A is a combination of the semiconductor ICs shown in FIGS. 3A and 4A, which can be used for any standby states of an input signal logic signal IN. It is, thus, effective for the leakage current reduction in both active and standby modes. Also, this embodiment IC is useful for the case that input signals are unpredictable.

Referring to FIG. 5A, a controlled inverter logic circuit 510 includes series-connected PMOS transistor 511 and NMOS transistor 513 and additional PMOS transistor 515 and NMOS transistor 517. The PMOS transistor 515 is inserted between the source of the PMOS transistor 511 and a power line of power supply voltage VDD. The NMOS transistor 517 is inserted between the source of the NMOS transistor 513 and a power line of ground level voltage VSS. A node 519 of the connected drains of the PMOS and NMOS transistors 515 and 513 is connected to first inputs of a NOR gate 521 and a NAND gate 523. The outputs of the NOR gate 521 and the NAND gate 523 are connected to the gates of the PMOS transistor 515 and the NMOS transistor 517, respectively. An input logic signal IN is fed to the gates of the PMOS and NMOS transistors 511 and 513. Another input logic signal IN_b is fed to second inputs of the NOR gate 521 and the NAND gate 523.

An output logic signal OUT provided from the node 519 is an inverted or complementary version of the input logic signal IN. The NOR gate 521 logically combines the output logic signal OUT and the complementary input logic signal IN_b and a NOR output signal is provided as a feedback signal FBp to the gate of the PMOS transistor 515. The NAND gate 523 logically combines the output logic signal OUT and the complementary input logic signal IN_b and a NAND output signal is provided as a feedback signal FBn to the gate of the NMOS transistor 517.

The controlled inverter logic circuit 510 is a low- and high-power gating CMOS inverter and has an associated symbol is shown by reference number 505 for the purpose of example. The controlled inverter logic circuit 510 is used for the either case of high or low input standby state.

Figure 5B:
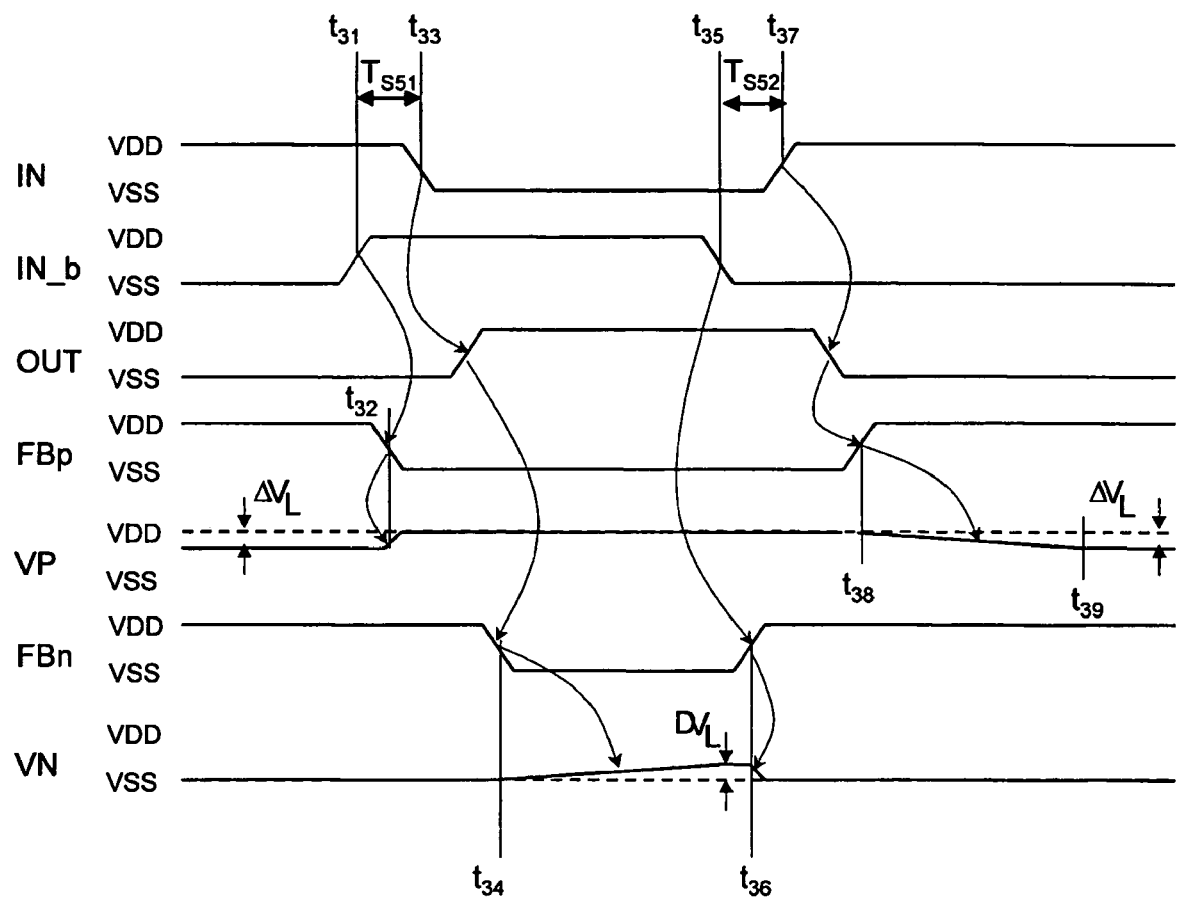
FIG. 5B is a timing sequence diagram showing signals of the semiconductor IC shown in FIG. 5A.

FIG. 5B shows the relative timing sequence for the signals of the semiconductor IC shown in FIG. 5A. The complementary input logic signal IN_b transitions earlier than the input logic signal IN, as shown in FIG. 5B. It is noted that the signals shown in FIG. 5B are a combination of the signals shown in FIGS. 3B and 4B.

Referring to FIGS. 5A and 5B, in a case where the input logic signal IN transitions from the "high" state to the "low" state (at time $t_{33}$), the PMOS transistor 51 is turned on and the NMOS transistor 513 is turned off. The output logic signal OUT goes "high". The complementary input logic signal IN_b goes "high" at time $t_{31}$ earlier than time $t_{33}$ by time interval Ts. In response to the "low" to "high" transition of the complementary input logic signal IN_b, the feedback signal FBp from the NOR gate 521 transitions from the "high" to "low" state (at time $t_{32}$).

In response to the output logic signal OUT being "high", the feedback signal FBn from the NAND gate 523 goes "low" (time $t_{34}$), with the result that the NMOS transistor 517 is turned off. While the NMOS transistor 513 leaks, an intermediate node VN (the connected source of the NMOS transistor 513 and drain of the NMOS transistor 517) slightly rises from the ground level VSS by an amount $\Delta V_L$. This voltage rising at the intermediate node VN is continued until the current supplied from the NMOS transistor 517 balances the current flowing in the NMOS transistor 513.

The input logic signal IN transitions from "low" to "high" logic state (time $t_{37}$). At time $t_{35}$ earlier than time $t_{37}$ by the time interval Ts, the complementary input logic signal IN_b goes "low", with the result that the feedback signal FBn from the NAND gate 523 goes "high". The intermediate node VN is pulled down to the low level voltage VSS (at time $t_{36}$). Thereafter, with the "low" to "high" transition of the input logic signal IN, the PMOS transistor 511 and the NMOS transistor 513 are turned off and turned on, respectively, so that the output logic signal OUT goes "low". The feedback signal FBp goes "high" (at time $t_{38}$), with the result that the PMOS transistor 515 for power gating is turned off. While the PMOS transistor 511 leaks, an intermediate node VP (the connected source of the PMOS transistor 511 and drain of the PMOS transistor 515) is slightly lowered from the power supply level of VDD by an amount $\Delta V_L$. This voltage lowering at the intermediate node VP is continued until the current supplied from the PMOS transistor 515 balances the current flowing in the PMOS transistor 511 (at time $t_{39}$).

Figure 6A:
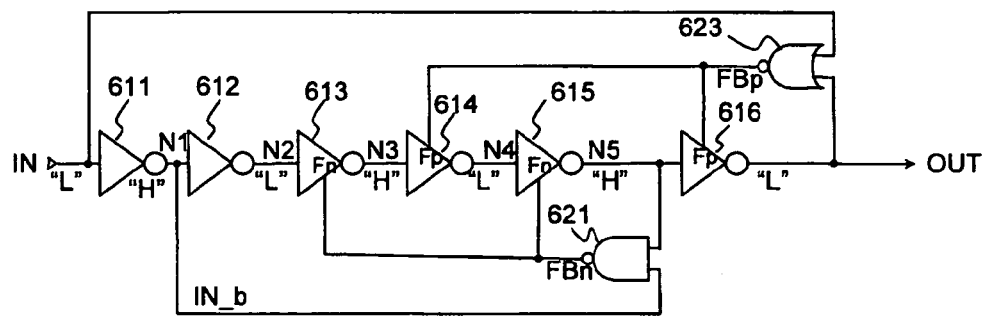
FIG. 6A is a circuit diagram showing a semiconductor IC having an inverter chain according to another embodiment of the present invention.

FIG. 6A shows a semiconductor IC according to another embodiment of the present invention. It is an example of practical application implementing the logic inverters of the semiconductor ICs shown in FIGS. 3A and 4A. The inverter chain functions as a buffer and operates with power supply voltage VDD and ground level voltage VSS. The chain including a plurality of inverters receives an input logic signal IN and provides an output logic signal OUT, the logic state of which depends upon that of the input logic signal IN.

Referring to FIG. 6A, a semiconductor IC includes a chain of six inverters 611-616. Each of the first and second inverters 611 and 612 is the same as the inverter logic circuit 110 shown in FIG. 1A. Each of the third and fifth inverters 613 and 615 is the same as the low-power gating CMOS inverter 305 shown in FIG. 3A. Each of the fourth and sixth inverters 614 and 616 is the same as the high-power gating CMOS inverter 405 shown in FIG. 4A. The six inverters 611-616 are connected through intermediate nodes N1-N5. The output from each inverter at the intermediate node is fed as an intermediate input signal to a downward inverter.

The outputs of the first and fifth inverters 611 and 615 are fed to a NAND gate 621. The input logic signal IN and the output logic signal OUT (the output of the sixth inverter 616) are fed to a NOR gate 623. The NAND gate 621 corresponds to the NAND gate 321 shown in FIG. 3A. The NOR gate 623 corresponds to the NOR gate 421 shown in FIG. 4A. The output from the NAND gate 621 is the feedback signal FBn that is provided to the gates of the NMOS transistors 315 (see FIG. 3A) forming the third and fifth inverters 613 and 615. The output from the NOR gate 623 is the feedback signal FBp that is provided to the gates of the PMOS transistors 415 (see FIG. 4A) forming the fourth and sixth inverters 614 and 616.

Figure 6B:
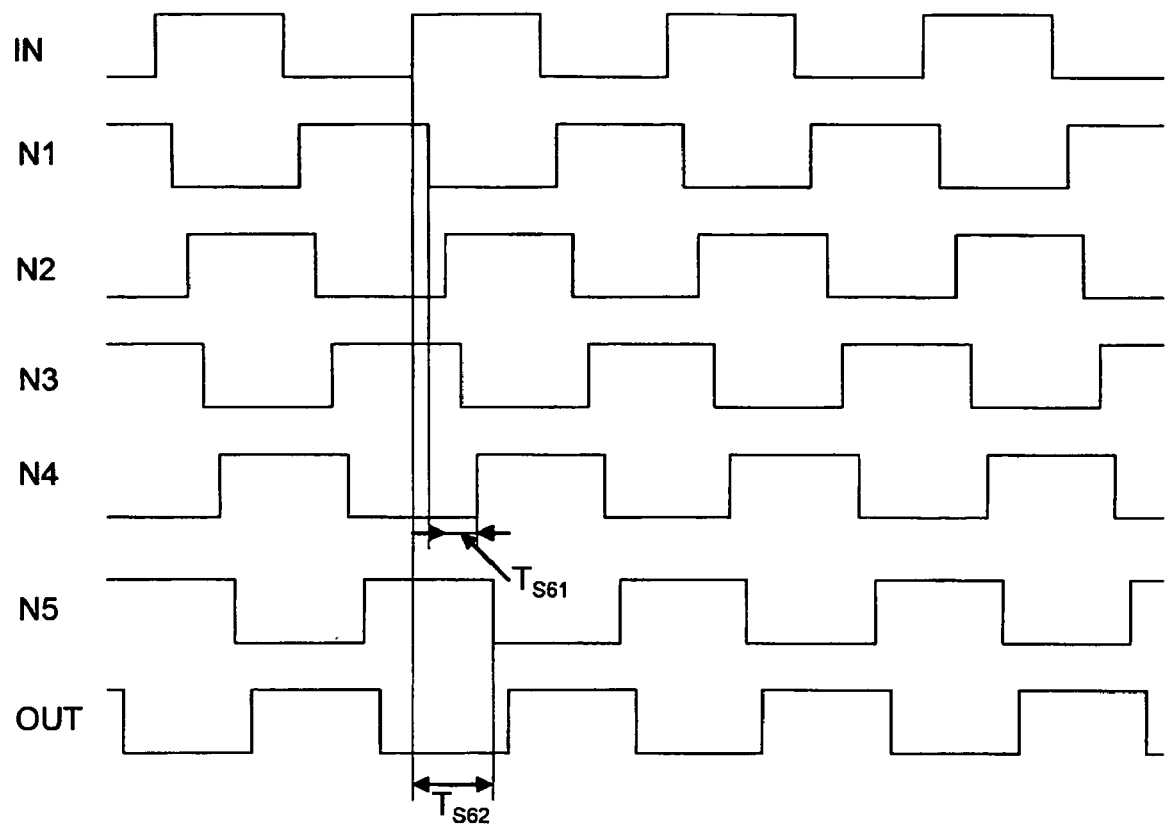
FIG. 6B is a timing sequence diagram showing signals of the semiconductor IC shown in FIG. 6A.

FIG. 6B shows the relative timing sequence for the signals of the semiconductor IC shown in FIG. 6A. It is noted that rising and falling transition timings of the signals are ignored for the purpose of showing the timing relationship between the signals.

Referring to FIGS. 6A and 6B, each of the inverters 611-616 has a time delay and thus, its intermediate output signal is delayed from its intermediate input signal. In the semiconductor IC, the fifth intermediate input signal (at node N4), the first intermediate output signal of the inverter 611 (at node N1), and the fifth intermediate output signal (at node N5) correspond to the input logic signal IN and the complementary input logic signal IN_b and the output logic signal OUT shown in FIG. 3A, respectively. Similarly, the sixth intermediate input signal (at node N5), the input logic signal IN and the output signal OUT correspond to the input logic signal IN, the complementary input logic signal IN_b, and the output logic signal OUT shown in FIG. 4A, respectively. Also, the feedback signal FBn from the NAND gate 621 correspond to the feedback signal FBn shown in FIG. 3A and the feedback signal FBp from the NOR gate 623 correspond to the feedback signal FBp shown in FIG. 4A. $T_{S61}$ corresponds to the time interval Ts shown in FIG. 3B. $T_{S62}$ corresponds to time interval Ts shown in FIG. 4B.

Figure 7A:
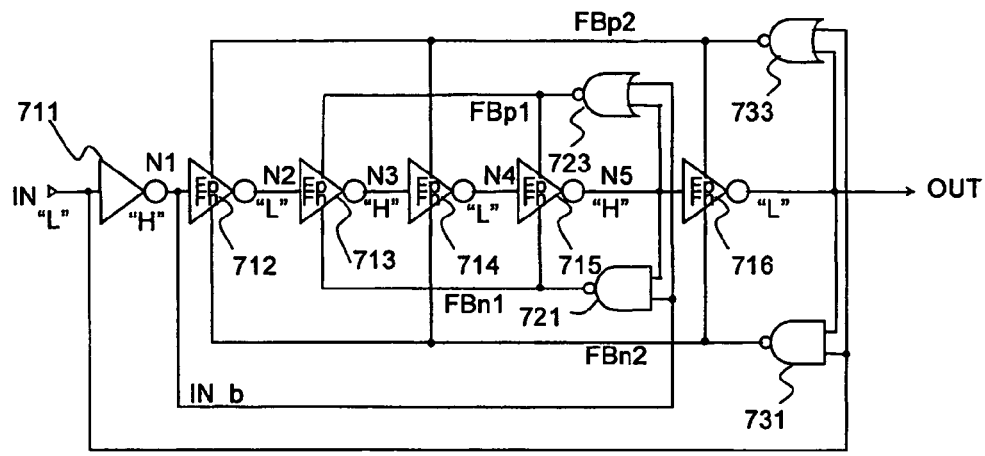
FIG. 7A is a circuit diagram showing a semiconductor IC having an inverter chain according to another embodiment of the present invention.

FIG. 7A shows a semiconductor IC according to another embodiment of the present invention. It is an example of practical application implementing the logic inverters of the semiconductor IC shown in FIG. 5A. The inverter chain operates as a buffer. Referring to FIG. 7A, a semiconductor IC includes a chain of six inverters 711-716 through intermediate nodes N1-N5. The first inverter 711 is the same as the inverter logic circuit 110 shown in FIG. 1A. Each of the second to sixth inverters 712 and 716 is the same as the low- and high-power CMOS inverter 505 shown in FIG. 5A. The outputs of the first and fifth inverters 711 and 715 are fed to a NAND gate 721 and a NOR gate 723 that correspond to the NAND gate 523 and the NOR gate 521, respectively, shown in FIG. 5A. Similarly, the input logic signal IN and the output logic signal OUT (the output of the sixth inverter 716) are fed to a NAND gate 731 and a NOR gate 733 that correspond to the NAND gate 523 and the NOR gate 521, respectively, shown in FIG. 5A. The feedback signal FBn1 from the NAND gate 721 is provided to the gates of the NMOS transistors 517 and the feedback signal FBp1 from the NOR gate 723 is provided to the gates of the PMOS transistors 515 (see FIG. 5A) forming the third and fifth inverters 713 and 715. The feedback signal FBn2 from the NAND gate 731 is provided to the gates of the NMOS transistors 517 and the feedback signal FBp2 from the NOR gate 733 is provided to the gates of the PMOS transistors 515 (see FIG. 5A) forming the second and sixth inverters 712 and 716.

Figure 7B:
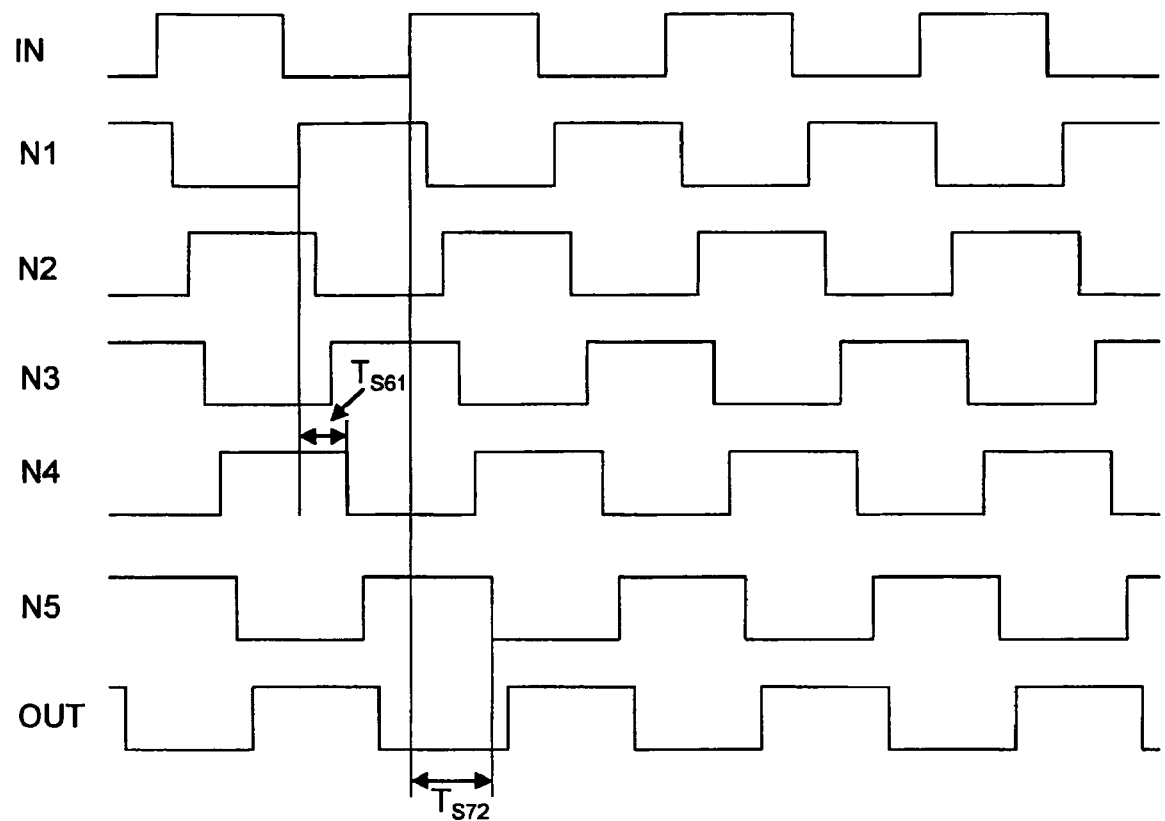
FIG. 7B is a timing sequence diagram showing signals of the semiconductor IC shown in FIG. 7A.

Similarly to the inverters 611-616 shown in FIG. 6A, the inverters 711-716 shown in FIG. 7A have time delays. FIG. 7B shows the relative timing signals of the semiconductor IC shown in FIG. 7A. In FIG. 7B, times $T_{S71}$ and $T_{S72}$ correspond to times $T_{S51}$, and $T_{S52}$ shown in FIG. 5B, respectively.

The semiconductor ICs described above as embodiments in accordance with the present invention have various variations. The threshold of the NMOS transistors 315, 517 and PMOS transistors 415, 515 for power gating can be statically held or be dynamically varied. Also, the NAND and NOR gates for providing feedback signals to the power gating transistors can be controlled by another deep power down stages for the maximum power saving, if the semiconductor IC device can be idle for very long time.

The chain of inverters depicted in FIGS. 6A and 7A can be configured differently. For example, the number of chained inverters are not necessarily six. The inputs to the NAND gates and the NOR gates that produce feedback signals should be earlier phase signals derived from the upward inverters.

Figure 8:
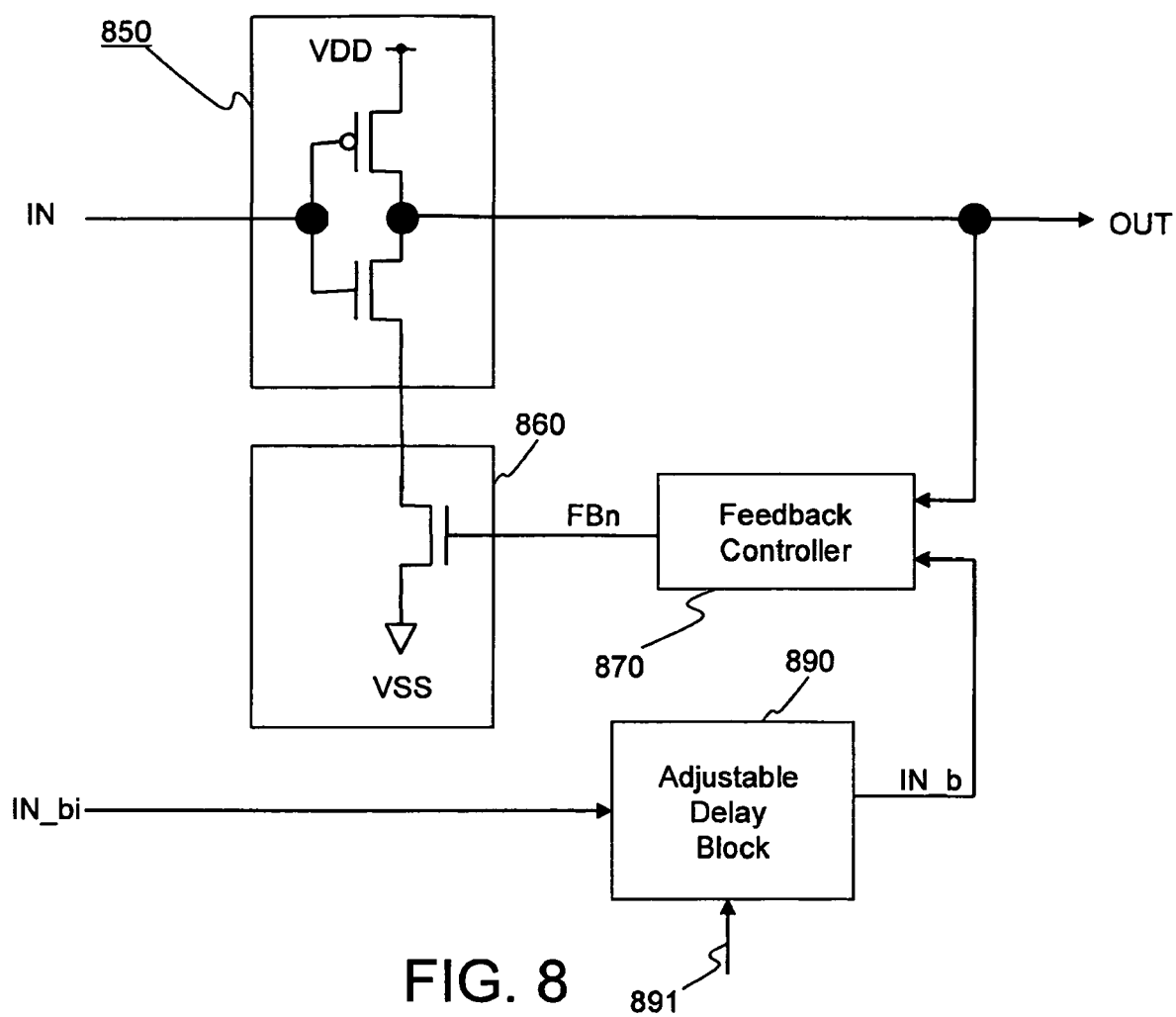
FIG. 8 illustrates a semiconductor IC having an adjustable time delay according to another embodiment of the present invention.

The time interval Ts between the input logic signal IN and the complementary input logic signal IN_b can be adjustable using separate delay control logic circuitry. Referring to FIG. 8 which shows a semiconductor integrated circuit (IC) according to another embodiment of the present invention, the semiconductor IC includes an inverter block 850 having a series-connected PMOS and NMOS transistors, a power gating circuit 860 having a MOS transistor and a feedback controller 870 having a logic gate. The inverter block 850 is provided with an input logic signal IN and provides an output logic signal OUT. The semiconductor IC further includes an adjustable delay block 890 that receives a complementary input logic signal IN_bi and a delay control signal 891 provided by a delay controller (not shown). The complementary input logic signal IN_bi has opposite logic states to the input logic signal IN with or without time delay therefrom. The adjustable delay block 890 delays the complementary input logic signal IN_bi in response to the delay control signal 891 and provide a time-delayed complementary input logic signal IN_b to the feedback controller 870. The delayed time interval Ts between the input logic signal IN and the complementary input logic signal IN_b is adjusted.

The adjustable time delay shown in FIG. 8 can be applied to a CMOS inverter having a high-power gating transistor as shown in FIG. 4A also. Furthermore, it is applicable to the inverter shown in FIG. 5A.

While the inverters have been described as embodiments in accordance with the present invention, other types of logic gates (e.g., NAND, NOR, Exclusive-OR, AND, OR) can adopt the present invention, the logic gates providing logic outputs based on a plurality of input logic signals.

Figure 9A:
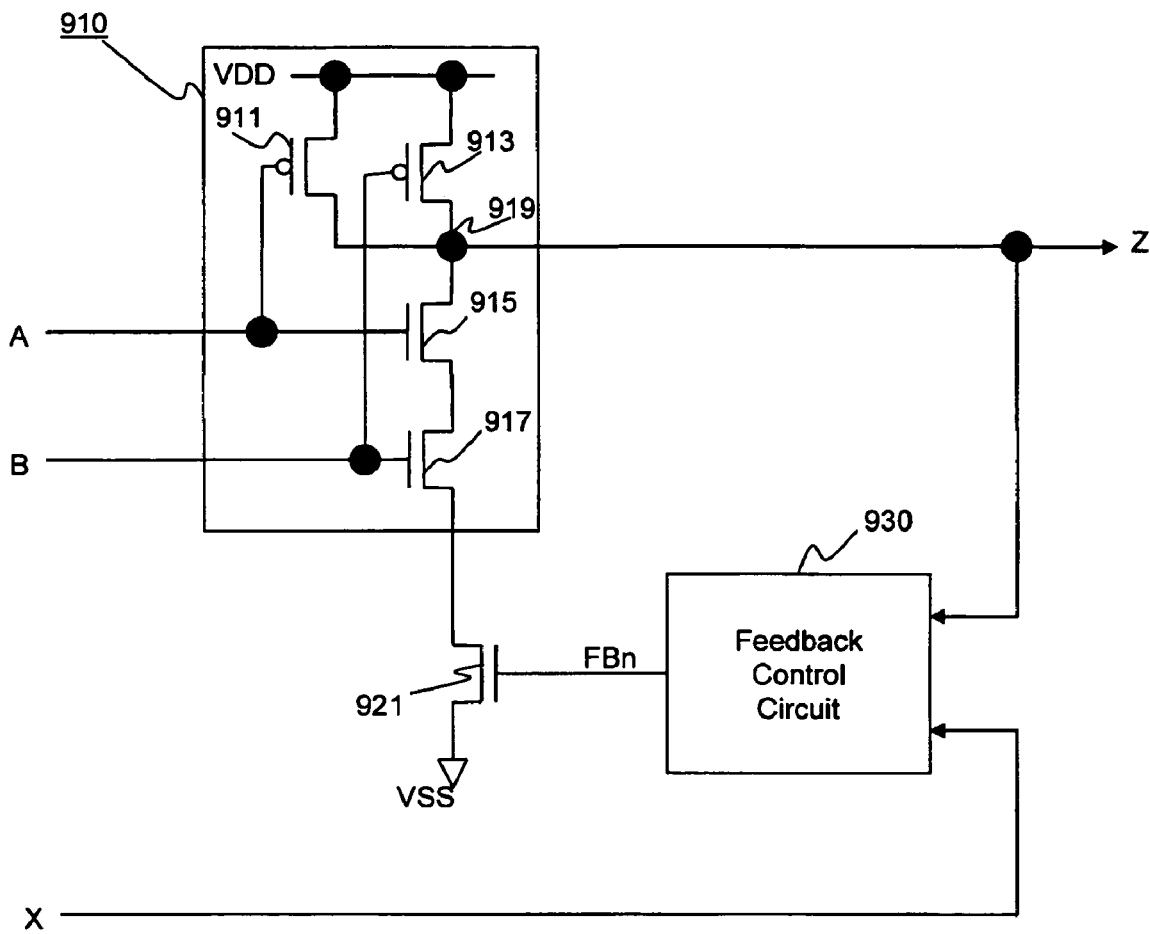
FIG. 9A illustrates a semiconductor IC having a NAND logic function responding to a plurality of input logic signals according to another embodiment of the present invention.

FIG. 9A shows another example of the present invention. Referring to FIG. 9A, a semiconductor integrated circuit includes a NAND block 910 having parallel-connected PMOS transistors 911 and 913 and series-connected NMOS transistors 915 and 917. Two input logic signals A and B are fed to the NAND block 910 which in turn provides an output logic signal Z from a connected node 919, the signal Z being NAND logic output of the inputs A and B. An additional NMOS transistor 921 for power gating is inserted between the NMOS transistor 917 and the low power line of ground level voltage VSS. A feedback control circuit 930 having logic circuitry receives the output logic signal Z as well as an additional input logic signal X that relates to one of the two input logic signals A and B: for example, a complementary version of the input logic signal A or B, with different transition timing.

In response to the output logic signal Z and the additional input logic signal X, the feedback control circuit 930 provides a feedback signal FBn to the gate of the power gating NMOS transistor 921. With the NMOS transistor responding to the output logic signal Z, the semiconductor IC can perform a self leakage reduction. Therefore, current leakage can be reduced in a standby or sleep mode, with the result that the power consumption by the logic gate 910 is reduced.

Figure 9B:
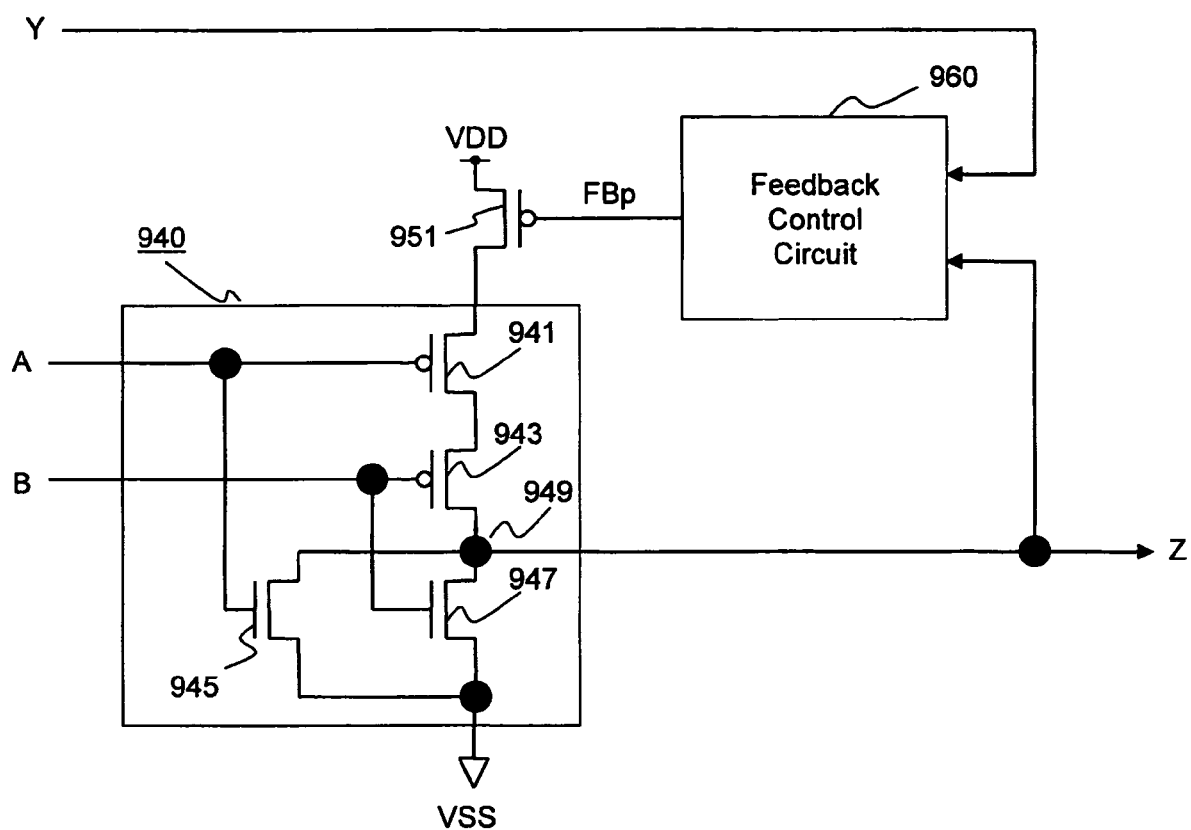
FIG. 9B illustrates a semiconductor IC having a NOR logic function responding to a plurality of input logic signals according to another embodiment of the present invention.

FIG. 9B shows another example of the present invention. Referring to FIG. 9B, a semiconductor integrated circuit includes a NOR block 940 having series-connected PMOS transistors 941 and 943 and parallel-connected NMOS transistors 945 and 947. Two input logic signals A and B are fed to the NOR block 940 which in turn provides an output logic signal Z from a connected node 949, the signal Z being NOR logic output of the inputs A and B. An additional PMOS transistor 951 for power gating is inserted between the PMOS transistor 941 and the power supply line of high level voltage VDD. A feedback control circuit 960 having logic circuitry receives the output logic signal Z as well as an additional input logic signal Y that relates to one of the two input logic signals A and B: for example, a complementary version of the input logic signal A or B, with different transition timings.

In response to the output logic signal Z and the additional input logic signal Y, the feedback control circuit 960 provides a feedback signal FBp to the gate of the power gating NMOS transistor 921. With the PMOS transistor responding to the output logic signal Z, the semiconductor IC can perform a self leakage reduction. Therefore, current leakage can be reduced in a standby or sleep mode, with the result that the power consumption by the logic gate 940 is reduced.

The NAND gate shown in FIG. 9A can be applied to the NAND gates 321 and 523 shown in FIGS. 3A and 5A for providing the feedback signals FBn to the NMOS transistors for power gating. Similarly, the NOR gate FIG. 9B can be applied to the NOR gates 421 and 521 shown in FIGS. 4A and 5A for providing the feedback signals FBp to the PMOS transistors for power gating. The NAND and NOR gates can contribute to reduction in total power consumption of the semiconductor ICs having the CMOS inverters shown in FIGS. 3A, 4A and 5A.

In semiconductor ICs according to the technologies for 100 nm or larger, active leakage is not so important, because it is relatively smaller than that of the semiconductor ICs according to the 90 nm, 65 nm, or 30 nm technologies. In available 90 nm model simulation, standby current in the semiconductor ICs according to the embodiments is roughly 30 times less in comparison to that of the conventional semiconductor ICs.

In the embodiments described above, the device elements and circuits are connected to each other as shown in the figures, for the sake of simplicity. In practical applications of the present invention to semiconductor ICs, devices, elements, circuits, etc. may be connected directly to each other. As well, devices, elements, circuits etc. may be connected indirectly to each other through other devices, elements, circuits, etc., necessary for operation of the semiconductor ICs. Thus, in actual configuration of semiconductor ICs, the circuit elements and devices are coupled with (directly or indirectly connected to) each other.

Although particular embodiments of the present invention have been described in detail, there are numerous variations. It should be appreciated that numerous variations, modifications, and adaptations may be made without departing from the scope of the present invention as defined in the claims.

What is claimed is:

1. A semiconductor integrated circuit (IC) operated with high and low power voltages, the semiconductor IC comprising a chain of a plurality of CMOS inverters that are coupled through intermediate nodes, the semiconductor IC responding to an input logic signal and providing an output logic signal, the chain of a plurality of CMOS inverters including at least first and second CMOS inverters, each of the first and second CMOS inverters having a first PMOS transistor and a first NMOS transistor that are series-coupled, a first intermediate input logic signal corresponding to the input logic signal being provided to the gates of the series-coupled first PMOS and NMOS transistors of the first CMOS inverter, the coupled node of which provides a first intermediate output logic signal that is a complementary version of the first intermediate input logic signal, a first feedback signal derived from the first intermediate output logic signal being provided to the first CMOS inverter to control the operation thereof, the first intermediate output logic signal being provided to the gates of the series-coupled first PMOS and NMOS transistors of the second CMOS inverter, the coupled node of which provides a second intermediate output logic signal that is a complementary version of the first intermediate output logic signal, a second feedback signal derived from the second intermediate output logic signal being provided to the second CMOS inverter to control the operation thereof, the second CMOS inverter having a second PMOS transistor, the drain of which is coupled to the source of the first PMOS transistor, the high power voltage being provided to the source of the second PMOS transistor, the gate of the second PMOS transistor responding to the second feedback signal.

2. The semiconductor IC of claim 1, further comprising a first logic gate for providing the first feedback signal in response to the first intermediate output logic signal and a second input logic signal that is derived from the input logic signal.

3. The semiconductor IC of claim 2, wherein the first logic gate comprises a NAND gate for providing the first feedback signal in response to the first intermediate output logic signal and the second input logic signal.

4. The semiconductor IC of claim 1, further comprising a second logic gate for providing the second feedback signal in response to the second intermediate output logic signal and a third input logic signal that is derived from the input logic signal.

5. The semiconductor IC of claim 4, wherein the second logic gate comprises a NOR gate for providing the second feedback signal in response to the second intermediate output logic signal and the third input logic signal.

6. A semiconductor integrated circuit operated with "high" and "low" level power supply voltages, the semiconductor IC comprising a chain of a plurality of CMOS inverters coupled through intermediate nodes, the chain including first and second CMOS inverters, the semiconductor IC responding to an input logic signal and providing an output logic signal, each of the first and second CMOS inverters including:

a first PMOS transistor and a first NMOS transistor that are series-coupled;

a second NMOS transistor, the drain of which is coupled to the source of the first NMOS transistor; and a second PMOS transistor, the drain of which is coupled to the source of the first PMOS transistor, the drain of the second NMOS transistor being coupled to the source of the first NMOS transistor, the drain of the second PMOS transistor being coupled to the source of the first PMOS transistor, the low power level voltage being provided to the source of the second NMOS transistor, the high power level voltage being provided to the source of the second PMOS transistor, a first intermediate input logic signal corresponding to the input logic signal being provided to the gates of the series-coupled first PMOS and NMOS transistors of the first CMOS inverter, the coupled node of which provides a first intermediate output logic signal that is a complementary version of the first intermediate input logic signal, first and second feedback signals derived from the first intermediate output logic signal being provided to the first CMOS inverter to control the operation thereof, the first intermediate output logic signal being as an second intermediate input logic signal provided to the gates of the series-coupled first PMOS and NMOS transistors of the second CMOS inverter, the coupled node of which provides a second intermediate output logic signal that is a complementary version of the first intermediate output logic signal, third and fourth feedback signals derived from the second intermediate input logic signal being provided to the second CMOS inverter to control the operation thereof.

7. The semiconductor IC of claim 1, wherein the first CMOS inverter further comprises:

a second NMOS transistor, the drain of which is coupled to the source of the first NMOS transistor, the low power level voltage being provided to the source of the second NMOS transistor, the gate of the second NMOS transistor responding to the first feedback signal.

8. The semiconductor IC of claim 7, further including a first logic gate for providing the first feedback signal in response to the first intermediate output logic signal state and a second input logic signal that is derived from the input logic signal, and a second logic gate for providing the second feedback signal in response to the second intermediate output logic signal state and a third input logic signal that is derived from the input logic signal.

9. The semiconductor IC of claim 8, wherein the first CMOS inverter further comprises:

a third PMOS transistor, the drain of which is coupled to the source of the first PMOS transistor, the high power level voltage being provided to the source of the third PMOS transistor, the gate of the third PMOS transistor responding to a third feedback signal provided by a third logic gate in response to the first intermediate output logic signal state and the second input logic signal.

10. The semiconductor IC of claim 9, wherein the second CMOS inverter further comprises:

a third NMOS transistor, the drain of which is coupled to the source of the first NMOS transistor, the low power level voltage being provided to the source of the third NMOS transistor, the gate of the third NMOS transistor responding to a fourth feedback signal provided by a fourth logic gate in response to the second intermediate output logic signal state and the third input logic signal.

* * * * *

UNITED STATES PATENT AND TRADEMARK OFFICE
CERTIFICATE OF CORRECTION

PATENT NO. : 7,292,061 B2 Page 1 of 1
APPLICATION NO. : 11/238975
DATED : November 6, 2007
INVENTOR(S) : HakJune Oh It is certified that error appears in the above-identified patent and that said Letters Patent is hereby corrected as shown below:

On The Title Page, Front page, item (73), Assignee's name, delete "Masaid" and insert therefor -- Mosaid --

Signed and Sealed this

Thirteenth Day of May, 2008

JON W. DUDAS
*Director of the United States Patent and Trademark Office*